(12) United States Patent
Hofman

(10) Patent No.: US 11,283,458 B1
(45) Date of Patent: Mar. 22, 2022

(54) DETERMINING AND COMPENSATING RESPECTIVE HARMONIC DISTORTIONS OF DIGITAL TO ANALOG AND ANALOG TO DIGITAL CONVERSIONS

(71) Applicant: Pavel Hofman, Pilsen (CZ)

(72) Inventor: Pavel Hofman, Pilsen (CZ)

( * ) Notice: Subject to any disclaimer, the term of this patent is extended or adjusted under 35 U.S.C. 154(b) by 0 days.

(21) Appl. No.: 17/092,378

(22) Filed: Nov. 9, 2020

(51) Int. Cl.
*H03M 1/06* (2006.01)
*G01R 23/20* (2006.01)

(52) U.S. Cl.
CPC .......... *H03M 1/0614* (2013.01); *G01R 23/20* (2013.01)

(58) Field of Classification Search
CPC .............. H03M 1/0614; G01R 23/20
USPC ......................................................... 341/118
See application file for complete search history.

(56) References Cited

U.S. PATENT DOCUMENTS

| | | | |
|---|---|---|---|
| 6,925,106 B2 | 8/2005 | Horaguchi et al. | |
| 8,290,032 B2 | 10/2012 | Asami | |
| 8,421,533 B2 | 4/2013 | Sun et al. | |
| 8,948,325 B1 | 2/2015 | Warner et al. | |
| 9,026,391 B2 | 5/2015 | Sogl et al. | |
| 9,111,047 B1 * | 8/2015 | Shridhar | G06F 13/40 |
| 9,152,747 B2 | 10/2015 | Liggiero | |
| 9,705,477 B2 * | 7/2017 | Velazquez | H03F 1/3241 |
| 9,929,758 B2 | 3/2018 | Jiang et al. | |
| 10,551,470 B2 | 2/2020 | Lloyd et al. | |

OTHER PUBLICATIONS

Hui L., Yue Q., Junwei L., Shuang L., "A Composite Strategy for Harmonic Compensation in Standalone Inverter Based on Linear Active Disturbance Rejection Control", MDP journal, Jul. 8, 2019c.
Novak A., Simon L., Loitton P., Melon M., "Predistortion Technique for Generating Spectrally Clean Excitation Signals for Audio and Electro-Acoustic Nonlinear Measurements", AES Convention Paper 1033, Mar. 10, 2019.
Anuchin A., Kulmanov V., Belyakov Y "Simulation of Power Converter Control System with Compensation of Harmonic Distortion in Output Voltage Waveform", International Siberian Conference Control and Communications, May 21-23, 2015, Omsk, Russia.
Santosh A., Tejulal A., "Effects of Harmonics on Electrical Equipment and their Compensation by using Shunt Active Power filter", IRJES vol. 3, Issue 11, Nov. 2015.
Eaton Corporation, "Harmonic Reduction Methods", Product Application AP04014001E, Apr. 2012.

* cited by examiner

*Primary Examiner* — Peguy Jean Pierre

(57) ABSTRACT

A method and an apparatus for determining and compensating respective harmonic distortions of digital to analog and analog to digital conversions are described. A signal from a digital to analog converter is passed through a plurality of calibration paths. Output signals from each calibration path, converted by an analog to digital converter, are analyzed in order to determine the harmonic distortions introduced by each side of the chain separately. One embodiment represents a digital sine generator which has harmonic distortions of its analog output continually compensated. Another embodiment compensates harmonic distortions introduced by an analog to digital converter in order to measure harmonic distortions of an analog signal precisely. Other embodiments are described and shown.

20 Claims, 24 Drawing Sheets

| | Measured native distortion | Measured compensated distortion | Improvement |
|---|---|---|---|
| H3 | -102.4 dB | -133.5 dB | 31.1 dB |
| H2 | -104.2 dB | -131.2 dB | 27.0 dB |
| H5 | -124.1 dB | -147.4 dB | 23.3 dB |
| H7 | -136.1 dB | -155.1 dB | 19.0 dB |
| H4 | -140.2 dB | -148.0 dB | 7.8 dB |
| H9 | -141.4 dB | -152.4 dB | 11.0 dB |
| H6 | -146.5 dB | -147.4 dB | 0.9 dB |
| H10 | -149.5 dB | -150.6 dB | 1.1 dB |
| H8 | -151.2 dB | -149.6 dB | -1.6 dB |

Fig. 20

DETERMINING AND COMPENSATING RESPECTIVE HARMONIC DISTORTIONS OF DIGITAL TO ANALOG AND ANALOG TO DIGITAL CONVERSIONS

CROSS-REFERENCE TO RELATED APPLICATIONS

This application claims the benefit of provisional patent application Ser. No. 62/938,379, filed on Nov. 21, 2019 by the present inventor.

BACKGROUND—PRIOR ART

The following is a tabulation of some prior art that presently appears relevant:

| U.S. Patents | | | |
|---|---|---|---|
| Pat. No. | Kind Code | Issue Date | Patentee |
| 9,026,391 | B2 | May 5, 2015 | Sogl et al. |
| 6,925,106 | B2 | Aug. 2, 2005 | Horaguchi etal. |
| 8,290,032 | B2 | Oct. 16, 2012 | Asami |
| 8,948,325 | B1 | Feb. 3, 2015 | Warner et al. |
| 9,152,747 | B2 | Oct. 6, 2015 | Liggiero |
| 9,929,758 | B2 | Mar. 27, 2018 | Jiang et al. |
| 10,551,470 | B2 | Feb. 4, 2020 | Lloyd et al. |

Nonpatent Literature Documents

Hui L., Yue Q., Junwei L., and Shuang L., MDP journal, "A Composite Strategy for Harmonic Compensation in Standalone Inverter Based on Linear Active Disturbance Rejection Control" (Jul. 8, 2019)
Novak A., Simon L., Lotton P., Melon M., AES Convention Paper 1033, "Predistortion Technique for Generating Spectrally Clean Excitation Signals for Audio and Electro-Acoustic Nonlinear Measurements" (Mar. 10, 2019)
Anuchin A., Kulmanov V., Belyakov Y., International Siberian Conference Control and Communications, "Simulation of Power Converter Control System with Compensation of Harmonic Distortion in Output Voltage Waveform" (May 2015)
Santosh A., Tejulal A., IRJES Volume 3, Issue 11, "Effects of Harmonics on Electrical Equipment and their Compensation by using Shunt Active Power filter" (November 2015)
EATON Corporation, Product Application AP04014001E, "Harmonic Reduction Methods" (April 2012)

Every digital to analog conversion and analog to digital conversion is affected by a nonlinear harmonic distortion. The harmonic distortion changes frequency spectrum of the signal such that multiples of the original frequencies are created, with various amplitude and phase.

FIG. 1. depicts a measurement loopback arrangement. A source 2 provides a precise sine digital signal. The digital signal is converted to its analog form by a digital to analog converter 4 (DAC). The analog signal is passed through a measured device-under-test 6 (DUT). A signal produced by the device-under-test is converted to its digital form by an analog to digital converter 5 (ADC).

Harmonic signals are used for measuring harmonic distortions of input/output devices. Harmonic distortions introduced by the measuring chain add up to distortions caused by the measured device-under-test. In order to obtain relevant measurements of the device-under-test distortions, the distortions introduced by the measuring chain must be significantly lower than the distortions of the device-under-test.

As prior arts show, when complex amplitudes (that is amplitude levels and phase shifts) of the distorting frequencies are known (measured or otherwise determined), it is possible to eliminate them by subtracting a harmonic signal of equal frequency, amplitude, and phase from the measured signal.

FIG. 2 depicts a prior-art method which compensates the joint distortions, introduced by the DAC 4 and ADC 5 sides, on side of the DAC 4. Selectors 12A and 13A route the analog signal passes either through the device-under-test 6, or through a calibration function 16. The calibration function 16 scales amplitude of the analog signal from the DAC 4 to correspond to output level of the device-under-test 6, pre-measured by an analyzing function 7 behind the ADC 5. Distortion amplitudes of the calibration path signal are sampled by the ADC 5, measured by the function 7, and scaled by a method controller 9A to correspond to amplitude of the undistorted harmonic signal entering the DAC 4, as determined by an analyzing function 8. A compensation function 11 subtracts the scaled distortions from the undistorted harmonic signal to create a signal pre-distorted with inverted joint distortions of the DAC and ADC sides.

FIG. 3 depicts another prior-art method which compensates the joint loopback distortions on the ADC side, before the digital signal is passed for analysis. During calibration the analyzing function 7 measures harmonic distortions of the calibration signal, passed through the calibration function 16. A compensation function 10 subtracts the calibrated joint harmonic distortions from the signal produced by the device-under-test signal, sampled by the ADC 5, in order to remove the joint harmonic distortions from the measured signal.

Disadvantages of Compensating the Joint Distortions

Harmonic distortions are measured in the digital signal behind the ADC 5. As a result, the measured values represent a combination of distortions introduced by the DAC side 4, distortions introduced along the analog path between the DAC 4 and ADC 5, and distortions introduced by the ADC side 5.

Typically the analog path has a frequency-dependent amplitude gain and introduces a frequency-dependent phase shift. As a result, both phase and relative amplitudes of frequencies generated by the DAC side are be changed when traversing such analog path. Therefore, pre-distorting the generated signal by subtracting the joint distortions from the signal before the DAC 4 does not yield correct results.

Also, if frequency transfer of the device-under-test 6 is different from frequency transfer of the calibration function 16, the joint distortions as determined during calibration differ from the joint distortions of the DAC and ADC sides when the signal actually passes the device-under-test 6. Therefore, compensating the calibration distortion behind the ADC does not yield correct results either.

SUMMARY

Embodiments determine and compensate respective contribution of the DAC side and respective contribution of the ADC side to the joint harmonic distortions of the chain, being measured in the digital signal behind the ADC.

Determining the respective distortions for the DAC side involves at least measuring amplitude gain and phase shift of several calibration paths for a fundamental frequency and its higher harmonics, measuring joint distortions for each path for a precise sine signal at given DAC level, and finding a solution to a set of equations.

Another embodiment constitutes a distortion-compensated single-tone signal generator achieved by further compensating the calculated distortions on the DAC side.

Another embodiment compensates distortions of the ADC side by further measuring the remaining distortions on ADC side and compensating the measured distortions on the ADC side.

Advantages

Accordingly several advantages of one or more aspects are as follows: the DAC side, when compensated with distortions introduced by the DAC side, generates a distortion-free analog sine signal; the ADC side, when compensated with distortions introduced by the ADC side, does not add false distortions when measuring distortions of an analog harmonic signal. Other advantages of one or more aspects will be apparent from a consideration of the drawings and ensuing description.

DETAILED DESCRIPTION

In order to determine the respective contributions of the DAC and ADC sides to the joint harmonic distortions of the loopback chain, embodiments pass the analog signal produced by the DAC side to the ADC side through several calibration paths. All calibration paths must attenuate the fundamental frequency spectrum component by approximately same ratio and introduce an insignificant harmonic distortion themselves.

Main functions of an embodiment with two calibration paths are depicted in FIG. 4.

The embodiment determines respective contributions of the DAC and ADC sides to the joint harmonic distortions of the DAC/ADC loopback chain when the DAC converts a precise digital sine signal of a predetermined fundamental frequency. The embodiment involves at least the following steps.

Step 1 determines amplitude gain and phase shift at the fundamental frequency and at its higher harmonics for all the calibration paths. The transfer gain is calculated as a ratio of magnitude of the fundamental frequency spectrum component behind the ADC 5 and of magnitude of the fundamental frequency spectrum component present in the digital signal before the DAC 4. The phase shift is measured by two synchronously sampled channels of the analog to digital converter—an auxiliary channel is directly connected to the DAC output as a time reference, and the measurement channel receives signal passing through the calibration path.

The step may be performed by the functions intended for further calibration/compensation of their harmonic distortions, but other means of pre-measuring the transfer parameters of the calibration paths are possible. One embodiment of Step 1 is described in FIG. 5. However, other embodiments are possible, for example an embodiment which uses curve-fitting to determine the amplitudes and phase shifts.

Step 2 measures amplitude gain and phase shift of joint distortions for each calibration path, as the sine signal is traversing along a chain composed of the DAC 4, the currently selected calibration path, and the ADC 5. One embodiment of Step 2 uses Fast Fourier Transformation to determine the frequency parameters and comprises at least the following:

Length of the Fast Fourier Transformation is determined. For fundamental frequencies generated at integer Hz values it is convenient to use integer multiples of the ADC sampling frequency. For fundamental frequencies generated at non-integer Hz values the FFT length is determined such that the fundamental frequency centers on its corresponding FFT bin with a predetermined precision.

A sequence of digital samples is collected on the ADC side. Number of the samples equals the chosen FFT length.

FFT is calculated from the digital samples, identifying amplitude and phase shift of the fundamental frequency bin in the spectrum.

Attenuation ratio at the fundamental frequency of the currently selected calibration path is calculated. If the attenuation ratio differs from attenuation ratios of the other calibration paths by more than a predetermined tolerance, the calibration path must be adjusted to satisfy the condition.

A zero time of the fundamental frequency is determined. The zero time stands for a time it took the wave of the fundamental frequency to reach the current phase from the moment the wave had its phase at zero.

Amplitudes and phases of bins corresponding to all harmonic frequencies (multiples of the fundamental frequency) are identified. The phases are then rotated (time-shifted) to values corresponding to the zero time of the fundamental frequency. The amplitudes and corresponding zero-time rotated phases constitute the joint distortions profile.

The embodiment of Step 2 using FFT is described in FIG. 6. However, other embodiments are possible, for example an embodiment which determines the amplitudes and phase shifts with curve-fitting.

Step 3 calculates distortions contributed by the DAC and by the ADC sides. The calculation involves finding solutions to a set of equations where each equation corresponds to one calibration path. The distortion contributions are calculated individually for distortion frequencies which are contained in results of Step 1 and Step 2.

The signal at output of the DAC 4 contains a digital sine signal converted to its analog form and a sum of distortions introduced by the DAC side of the chain at all harmonic frequencies:

$$X = F_{DAC} + \sum_{n=2}^{N} H_{DACn} \quad \text{[Eq. 1]}$$

where X is the analog signal at output of the DAC 4, $F_{DAC}$ is a known complex amplitude of a single-tone sine signal generated by the source 2, and $H_{DACn}$ is the searched-for complex amplitude of n-th harmonic distortion introduced by the DAC 4 side as a result of the fundamental frequency passing through the DAC side.

The signal X passes through one of the calibration paths. Because every calibration path adds only an insignificant harmonic distortion, a signal Y arriving at input of the ADC side 5 is as follows:

$$Y = X \cdot G = F_{DAC} \cdot G_1 + \sum_{n=2}^{N} H_{DACn} \cdot G_n \quad \text{[Eq. 2]}$$

where Y is the analog signal behind the calibration path (functions 13 and 14 of the embodiment on FIG. 4), $G_1$ is a complex transfer of the calibration path at the fundamental frequency, as measured by Step 1, and $G_n$ is a complex transfer of the calibration path for the n-th harmonic, as measured by Step 1.

The signal Y is converted to its digital form by the ADC 5. This conversion adds further distortions introduced by the ADC side. The sum M of all distortions joint is measured by Step 2:

$$M = Y + \sum_{n=2}^{N} H_{ADCn} = F_{DAC} \cdot G_1 + \sum_{n=2}^{N} H_{DACn} \cdot G_n + \sum_{n=2}^{N} H_{ADCn} \quad [\text{Eq. 3}]$$

where M is the digital signal analyzed by the function 7 at output of the ADC by Step 2 and $H_{ADCn}$ is the searched-for complex amplitude of the n-th harmonic distortion introduced by the ADC side when a signal of the fundamental frequency is passing through the ADC side.

Also, the signal M consists of the fundamental frequency and joint distortions of the whole chain:

$$M = F_{ADC} + \sum_{n=2}^{N} H_{Cn} \quad [\text{Eq. 4}]$$

where $F_{ADC}$ is the complex amplitude of the fundamental frequency component of the signal, as measured by Step 2, and $H_{Cn}$ is the complex amplitude of the n-th joint harmonic distortion introduced by the whole analog chain, also measured by Step 2.

Combining Eq. 3 and Eq. 4 yields:

$$F_{DAC} \cdot G_1 + \sum_{n=2}^{N} H_{DACn} \cdot G_n + \sum_{n=2}^{N} H_{ADCn} = F_{ADC} + \sum_{n=2}^{N} H_{Cn} \quad [\text{Eq. 5}]$$

Since each component of Eq. 5 corresponds to its specific frequency, the equation can be split to the fundamental frequency part $$F_{DAC} \cdot G_1 = F_{ADC} \quad [\text{Eq. 6}]$$

and to the distortion frequencies part $$\sum_{n=2}^{N} H_{DACn} \cdot G_n + \sum_{n=2}^{N} H_{ADCn} = \sum_{n=2}^{N} H_{Cn} \quad [\text{Eq. 7}]$$

Eq. 7 reads that every joint n-th harmonic distortion $H_{Cn}$, as measured by Step 2, is a sum of a DAC-side n-th harmonic distortion $H_{DACn}$, attenuated and phase shifted by the complex transfer $G_n$ of the calibration path, and of an ADC-side n-th harmonic distortion $H_{ADCn}$.

When time of the harmonic functions corresponds to zero phase of the complex amplitude $F_{DAC}$, Eq. 6 can be written to an Euler's form:

$$d_1 \cdot g_1 \cdot \exp(j\varphi_1) = A_1 \quad [\text{Eq. 8}]$$

where $d_1$ is real amplitude of the generated signal, $g_1$ is real gain of the calibration path at the fundamental frequency, $\varphi_1$ is the phase shift of the calibration path at the fundamental frequency, and $A_1$ is complex amplitude of the fundamental frequency signal on the ADC side.

Harmonic distortions originate from their fundamental frequency. Therefore, their phases are directly related to phase of the fundamental frequency spectrum component. Because the fundamental frequency component on the ADC side is shifted by $\varphi_1$, n-th harmonic distortion on the ADC side is shifted by $n \cdot \varphi_1$.

Therefore, each n-th frequency part of Eq. 7 can be written to an Euler's form as:

$$d_n \exp(j\delta_n) \cdot g_n \exp(j\varphi_n) + a_n \exp(j(\alpha_n + n \cdot \varphi_1)) = c_n \exp(j(\gamma_n + n \cdot \varphi_1)) \quad [\text{Eq. 9}]$$

where $d_n$ is the searched-for amplitude of the n-th distortion on the DAC side, $\delta_n$ is the searched-for phase of the zero-time n-th distortion on the DAC side, $g_n$ is the known real gain of the calibration path at the n-th harmonic frequency, as measured in Step 1, $\varphi_n$ is the known phase shift of the calibration path at the n-th harmonic frequency, as measured in Step 1, $a_n$ is the searched-for amplitude of the n-th distortion on the ADC side, $\alpha_n$ is the searched-for phase of the zero-time n-th distortion on the ADC side, $\varphi_1$ is the known phase shift of the calibration path at the fundamental frequency, as measured in Step 1, $c_n$ is the known amplitude of the n-th joint distortion, as measured in Step 2 for the calibration path, and $\gamma_n$ is the known phase of the zero-time n-th joint distortion, also as measured in Step 2.

Measurements in Step 2 were performed on the ADC side and thus correspond to zero time of the fundamental frequency component on the ADC side. However, Eq. 9 was derived for zero time of the fundamental frequency component on the DAC side. Time shifting Eq. 9 by a delay introduced by the calibration path yields $$d_n \exp(j(\delta_n - n \cdot \varphi_1)) \cdot g_n \exp(j\varphi_n) + a_n \exp(j\alpha_n) = c_n \exp(j\gamma_n) \quad [\text{Eq. 10}]$$

In other words, the zero-time n-th joint distortion is a sum of (1) the n-th zero-time distortion on the DAC side, shifted in time backward by delay of the calibration path at the fundamental frequency (hence the $-n \cdot \varphi_1$ part of the exponent), being further attenuated ($g_n$) and rotated ($\varphi_n$) by the calibration path at the distortion frequency, and (2) the n-th zero-time distortion on the ADC side.

The Eq. 10 has four unknown variables $d_n$, $\delta_n$, $a_n$, $\alpha_n$. They represent the searched-for n-th distortion amplitudes and zero-time phases for DAC and ADC sides. All other variables are known—transfer parameters of the calibration path were measured in Step 1 and joint distortion amplitudes and zero-time phases were measured in Step 2.

Previous equations describe distortions as vector values at a single time moment. In order to find the unknown variable by curve-fitting, Eq. 10 can be rewritten to a function of time which provides model and observed values at any time t:

$$d_n \cdot g_n \cdot \cos(2\pi \cdot f_n \cdot t + \delta_n - n \cdot \varphi_1 + \varphi_n) + a_n \cdot \cos(2\pi \cdot f_n \cdot t + \alpha_n) = c_n \cdot \cos(2\pi \cdot f_n \cdot t + \gamma_n) \quad [\text{Eq. 11}]$$

Every calibration path provides one Eq. 11. All the calibration paths together yield a set of equations Eq. 11 for every n-th harmonic distortion.

Distortion profile of an analog input/output element changes with amplitude of the analog signal passing through the element. If for every calibration path the analog signal $F_{DAC}$ is generated at the same amplitude by the DAC in Step 2, the amplitude and phase distortions on the DAC side $d_n$, $\delta_n$ are closely similar in every Eq. 11 for each calibration path.

If all calibration paths have their amplitude gain at the fundamental frequency closely similar to each other, the fundamental frequency component of the signal on the ADC side will have its amplitude also closely similar for each calibration path in Step 2, resulting in closely similar distortion profiles of the ADC side. In such case the distortions parameters of the ADC side can (1) in Eq. 11 for the first path have phases and amplitudes identical $a_n^1 = a_n$, $\alpha_n^1 = \alpha_n$ and (2) in Eqs. 11 for the remaining paths have phases identical $\alpha_n^k = \alpha_n$ and amplitudes scaled to $a_n^k = g_1^k/g_1^1 \cdot a_n$, where $g_1^k$ is the amplitude gain of path k at the fundamental frequency. Please note that the scaling ratio $g_1^k/g_1^1$ is very close to number one for every the calibration path k because every path is required to have its amplitude gain at the fundamental frequency closely similar to the remaining paths.

As a result, if conditions for the equal levels on the DAC and ADC sides are satisfied for all calibration paths, all Eqs. 11 for every calibration path will use only the four searched-for variables $d_n$, $\delta_n$, $a_n$, $\alpha_n$—amplitudes and phases of harmonic distortions introduced by the DAC and ADC sides respectively.

One embodiment of finding the searched-for variables uses nonlinear regression (curve-fitting). The curve-fitting method is run for every predetermined distortion frequency, calculating the DAC and ADC distortion profiles for the given fundamental frequency. The procedure is described in FIG. 7A and FIG. 7B. Other embodiments of finding values of the searched-for variables in Step 3 are possible.

Another embodiment compensates distortions on the DAC side, as determined by at least Steps 1, 2, and 3. Step 4 uses the function 11 to compensate by pre-distortion. Such embodiment constitutes a distortion-compensated single-tone signal generator. FIG. 8A and FIG. 8B describe the procedure. Step 3 calculates amplitude and zero-time phase for every distortion frequency measured in Step 2. For every distortion frequency the embodiment generates a compensation digital sine signal scaled to the calculated amplitude and having its phase rotated from the calculated zero-time value to time given by the current phase shift of the fundamental frequency. The embodiment subtracts the generated compensation signals from the DAC side signal. Other embodiments of Step 4 are possible.

Another embodiment determined harmonic distortions introduced by the ADC side for precise measuring distortion of the device-under-test, by applying at least Steps 1, 2, 3, 4, and at least Step 5 as follows.

Step 5 measures the remaining harmonic distortions on the ADC side. It was shown that calculations in Step 3 yield amplitude and phase of ADC-side distortions. These distortions are thus relevant only for amplitude close to the amplitude present on the ADC side when Step 2 was measuring the joint distortions for the calculation. However, in order to measure distortions of the device-under-test precisely, distortions the ADC side need to be calibrated and compensated at amplitudes close to amplitudes produced by the device-under-test 6.

The embodiment uses a calibration path with adjustable output level in Step 5 and adjusts magnitude of the calibration path output signal to the magnitude of the device-under-test output signal, as sampled by the ADC and measured by the function 7.

The procedure measuring the actual distortions is similar to Step 2. But in Step 5 the measurement of joint distortions yields directly distortions introduced by the ADC side only, because Step 4 has already compensated distortions of the DAC side, making the DAC-side distortions in Eq. 7 equal to zero.

Another embodiment achieves a distortion-compensated ADC side for precise measuring distortion of the device-under-test, by applying at least Steps 1, 2, 3, 4, 5, and at least Steps 6 as follows.

Step 6 continually compensates the remaining distortions on the ADC side, using the function 10 to compensate by post-distortion The procedure is similar to Step 4, but the function 10 applies the ADC distortions to the ADC side. The compensation signal is obtained by interpolating amplitudes of the distortions, as determined by Step 5, from amplitude the signal was having during the calibration to momentary amplitude of the signal produced by the device-under-test 6, converted by the ADC 5 and measured by the analyzing function 7.

The embodiment is described in FIG. 9A and FIG. 9B, but other embodiments of Step 6 are possible.

Amplitude of the output signal produced by the device-under-test 6 can fluctuate. In one embodiment Step 5 measures the distortions of a signal with amplitude close to, above, and below amplitude of the device-under-test output signal. Step 6 then determines amplitude of the distortion relevant for the currently measured signal by interpolating from the set of calibrated distortions. Interpolation of the compensation profile for the ADC side is performed every measurement cycle. That ensures the interpolated calibration profile and the compensating signal always correspond to the last known amplitude of the signal produced by the device-under-test 6.

Distortions of the DAC output stage are influenced by the connected paths. Embodiment shown in FIG. 10 keeps all the calibration paths permanently connected to output of the DAC.

Another embodiment has the analog signal transferred by electricity. In this particular embodiment the calibration path A 14 is a first-order low-pass filter, constructed from a resistor and a capacitor, with cutoff frequency near the fundamental frequency. The calibration path B 15 is a voltage divider whose attenuation is set close to attenuation of the low-pass filter at the fundamental frequency.

An example implementation Impl. 1 of this embodiment was realized and measured. Audio device E-MU 0404 USB provided functions of the DAC 4 and ADC 5. The analyzing functions 7, 8, compensation functions 10, 11, and the controller function 9C were implemented in programming language Octave. Audio analyzing software Room EQ Wizard embodied the signal source 2 and the signal analyzer 3. The signal source 2 generated a sine signal at frequency 2,911 Hz, sampling rate 48 kHz, and sample width 24 bits. The signal analyzer 3 plotted spectrum charts, with FFT length of 256 k samples.

A circuit diagram of the two calibration paths is shown in FIG. 11. A 10-turn wire-wound potentiometer was used for the voltage divider calibration path. The higher inductance of the wire-wound potentiometer is inconsequential because transfer parameters of every calibration path are measured in Step 1 and enter the calculations in Step 3. The low-pass RC filter for the second calibration path consisted of a 10 kOhm resistor and a 10 nF foil capacitor which set the cut-off frequency of the low-pass filter to approximately 1.6 kHz.

FIG. 12 shows spectrum chart of the sine signal, as analyzed by the analyzer 3, with the voltage divider in the calibration path. The harmonic distortions shown on the chart represent the joint distortions of the DAC and ADC sides. The analyzer 3 measured and calculated value of total harmonic distortion THD at −94.6 dB.

The controller function 9C performed Steps 1 to 6 whereby it (1) calculated and compensated distortions on the DAC side, and (2) measured and compensated the remaining distortions on the ADC-side. FIG. 13 shows the resultant spectrum, as calculated by the analyzer 3, when the signal was passing through voltage divider calibration path. The THD was measured at −136.9 dB. FIG. 14 shows the spectrum when the ADC 5 was sampling a signal produced by the low-pass filter calibration path, while the distortion profile of the ADC side being used for the compensation was previously calibrated for the voltage divider calibration path. The THD was measured at −134.8 dB. The minor increase in measured distortion is attributed to measurement errors, non-zero distortions of the calibration paths, temperature, and momentary changes of parameters of components within the chain. The compensation kept THD at this level for tens of minutes after calibration.

Another example implementation Impl. 2 of the embodiment used audio device Infrasonic Quartet for the DAC 4 and the audio device E-MU 0404 USB for the ADC 5. The DAC and ADC were thus clocked independently, the conversion from digital to analog and sampling from analog to digital were running asynchronously. All the other functions and parameters of the generated sine signal were identical to the previous embodiment implementation.

FIG. 15 shows a spectrum chart of the sine signal, as analyzed by the analyzer 3, with the voltage divider in the calibration path. The harmonic distortions shown on the chart represent joint distortions of the DAC and ADC sides. The DAC 4 was processing a sine signal digitally generated at 2,911 Hz (exact integer value). Due to the independent clock of the ADC 5, the frequency of the analog signal, sampled by the ADC 5, was measured by the function 7 to be 2911.040 Hz. The analyzer 3 measured and calculated the THD at −94.6 dB.

The controller function 9C calibrated and compensated the respective distortions of the DAC and ADC sides by controlling Steps 1 to 6. FIG. 16 shows the resultant spectrum, as calculated by the analyzer 3, when the signal was passing through voltage divider calibration path. The THD was measured at −131.4 dB. FIG. 17 shows the spectrum when the signal was passing through the low-pass filter calibration path. The THD was measured at −130.4 dB.

Another embodiment represents a harmonic generator with continually compensated harmonic distortions. Calibration Steps 1 to 4 are running in a permanent loop. Because distortions on the DAC side are already being compensated by the previous cycles, the DAC-side distortions calculated by Step 3 are incrementally added to the distortion profile being currently compensated and the updated distortion profile is reloaded in the compensating function 11. The embodiment for a continually compensated generator is depicted in FIG. 18 and its procedure is described in FIG. 19A and FIG. 19B.

An example implementation Impl. 3 of the embodiment was realized and measured. Audio analyzer RTX6001 embodied the DAC 4 and ADC 5. In order to measure harmonic distortions of the generator output 20, audio analyzer Shibasoku 725D notch-filtered the DAC output signal, and level-calibrated analyzer QuantAsylum QA401 measured the residua of harmonic distortions behind the notch filter. FIG. 20 lists distortions measured at the output 20, for first disabled and then enabled compensation of the DAC side distortions.

Another embodiment represents a generator of a multitone analog signal with continually compensated harmonic distortions. In this embodiment the signal source 2, analyzing function 8, compensation function 11, and the DAC 4 are able to handle several signal channels independently. The source 2 generates a sine signal of different fundamental frequency into each channel. Steps 1 to 3 compensate single-tone harmonic distortions for each channel separately. Analog signals generated by each channel of the DAC 4 are mixed at the generator output to create the multitone distortion-compensated analog signal.

Another embodiment is able to measure harmonic distortions of an independently-running harmonic oscillator with distortion-compensated ADC. The embodiment measures the incoming frequency of the measured oscillator on the ADC side first. At that fundamental frequency, rounded to the closest integer value in Hz, Steps 1 to 6 perform calibration of the ADC side distortions. Measurements have revealed that harmonic distortion profiles of both the DAC and ADC vary only insignificantly in vicinity of the calibration frequency. Frequencies in the distortion profile of the ADC side, calibrated for the original frequency, are shifted to fit the momentary oscillator frequency measured by the function 7 in every measurement cycle.

In another embodiment the analog signal passing through the calibration paths is acoustical. The DAC function 4 comprises an electrical digital to analog converter and an electroacoustic transducer such as a speaker. The ADC function 5 comprises an electroacoustic transducer such as a microphone and an electrical analog to digital converter. A direct acoustic line with adjustable attenuation embodies the calibration path A 14, an acoustic low-pass filter embodies the calibration path B 15. The electrical converters used introduce harmonic distortions significantly lower than harmonic distortions introduced by the electroacoustic transducers. Using Steps 1 to 3 the embodiment estimates harmonic distortions of the transducer converting the electrical signal to the acoustical signal, using Step 4 the embodiment generates an acoustic wave signal with low harmonic distortion, and using Step 5 the embodiment estimates harmonic distortions of the transducer converting the acoustical signal to the electrical signal.

SCOPE

Although the description above contains many specificities, these should not be construed as limiting the scope of the embodiments but as merely providing illustrations of some of several embodiments. For example, amplitude gain and phase shift of the calibration paths at the specific frequencies as result of Step 1 can be obtained by a separate measurement. Amplitudes and phase shifts for fundamental and distortion frequencies as results of Steps 2 and 5 can be determined by curve fitting. Step 3 can estimate the amplitudes and phases of distortions on the DAC and ADC sides by finding complex vectors which best fit Eqs. 10 for all calibration paths, instead of curve-fitting waveforms of Eq. 11 in time domain.

Thus the scope of the embodiments should be determined by the appended claims and their legal equivalents, rather than by the examples given.

1: A measurement apparatus. If means of digital communication are provided, the apparatus can comprise a plurality of devices, such as a device being able to provide a digital sine signal and to convert a digital signal to its analog form, a device being able to convert an analog signal to its digital form and to analyze the digital signal, a device being able to control the method.

2: A source of a digital signal.

3: A digital signal analyzer. This function is present in embodiments which analyze performance of the device-under-test 6.

4: A digital to analog converter (DAC) which converts the digital signal from the source 2 to its analog form.

5: An analog to digital converter (ADC) which converts an analog signal from the device-under-test 6 and from calibration paths to its digital form. Conversion operations of the DAC 4 and of the ADC 5 can be timed by a common clock, or can be clocked independently.

6: A measured device-under-test (DUT).

Figure 1:
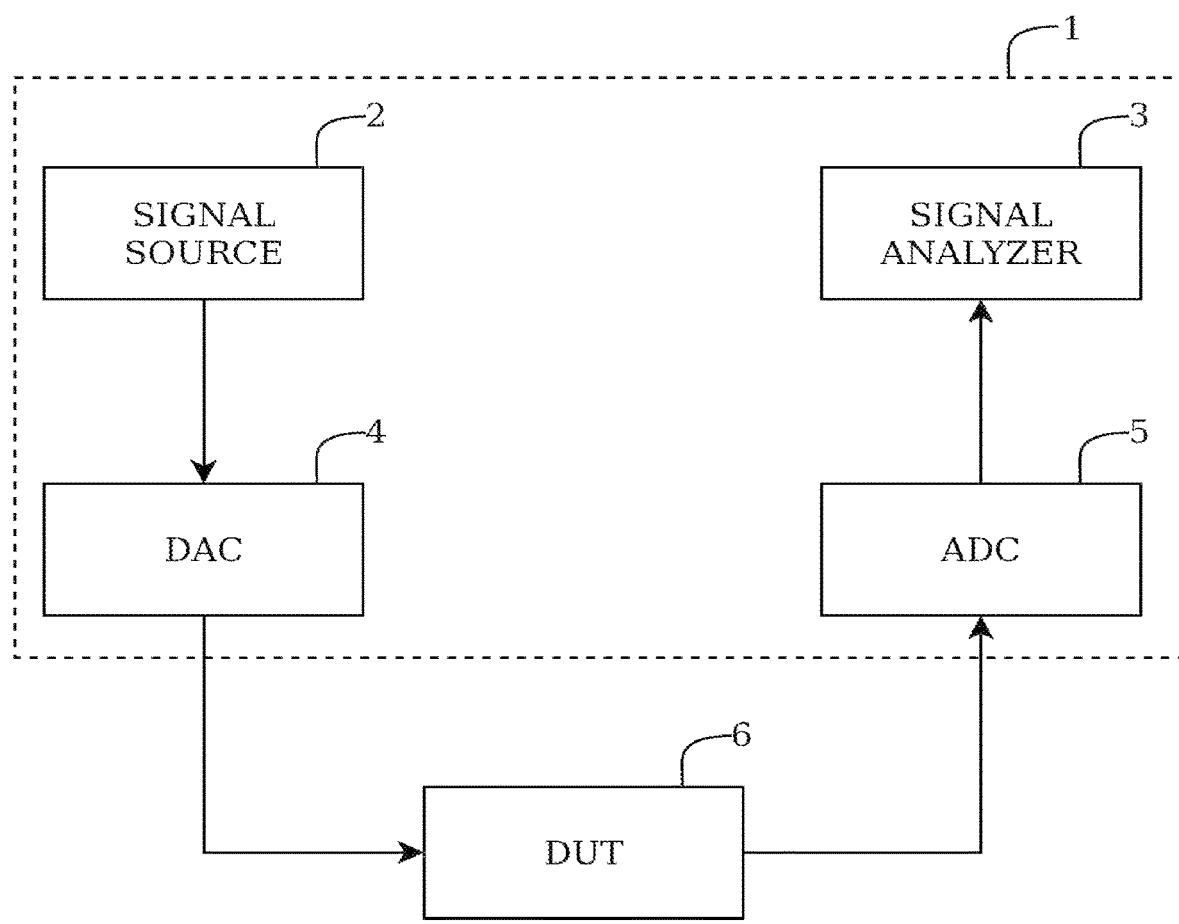
FIG. 1 depicts functions involved in a digital to analog to digital measurement loop with a measured device (device under test-device-under-test) inserted into the analog path. The functions are as follows.
Figure 2:
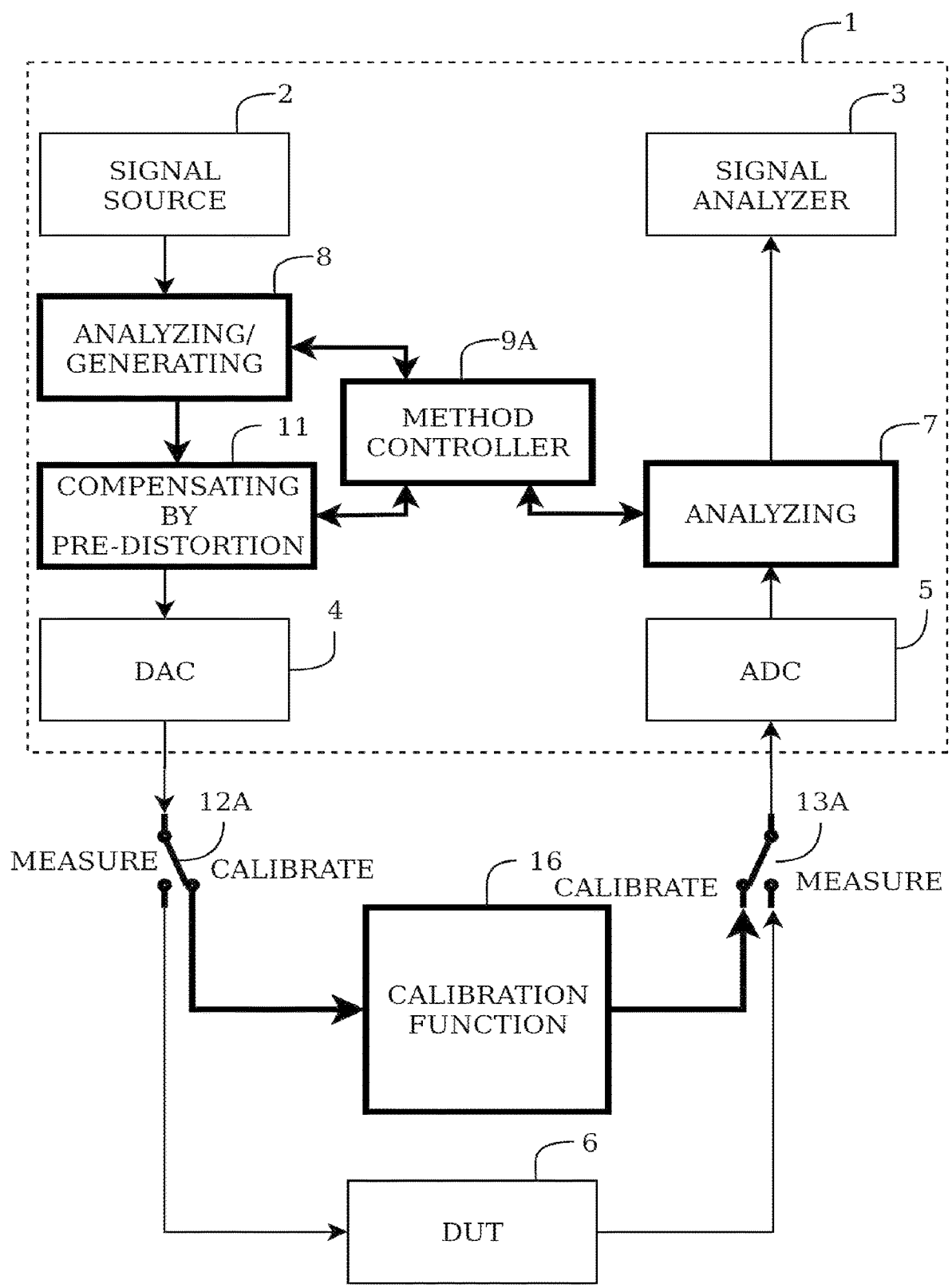

FIG. 2 depicts functions involved in compensation of joint harmonic distortions using pre-distortion on the DAC side. New functions introduced by the figure are as follows:

7: An analyzing function inserted behind the ADC 5 which determines momentary parameters (frequency, amplitude, phase) of the fundamental frequency in every measurement cycle. Additionally the function 7 measures harmonic distortions during calibration.

8: A function which determines momentary frequency, amplitude, phase of the signal from the source 2 in every cycle. In one embodiment the function analyzes the passing signal, in another embodiment it obtains the information from the signal source 2. In addition, the function is able to provide a sine signal at specific frequency and amplitude when instructed by the controller function. In one embodiment the function 8 provides the signal by requesting the signal from the signal source 2.

9A: A function which controls all functions involved in calibrating, calculating, and compensating joint distortions on the DAC side.

11: A function which pre-distorts the digital signal from the source 2 with a compensation profile determined by the controller function.

12A: A selector function which routes output signal from the DAC 4 to the device-under-test 6 during measurement and to the calibration function 16 during calibration.

13A: A selector function which provides input of the ADC 5 with a signal from output of the device-under-test 6 during measurement and from output of the calibration function 16 during calibration.

16: A calibration function which scales amplitude of the analog signal from the DAC 4 to a level closely similar to amplitude of the output signal produced by the device-under-test 6.

Figure 3:
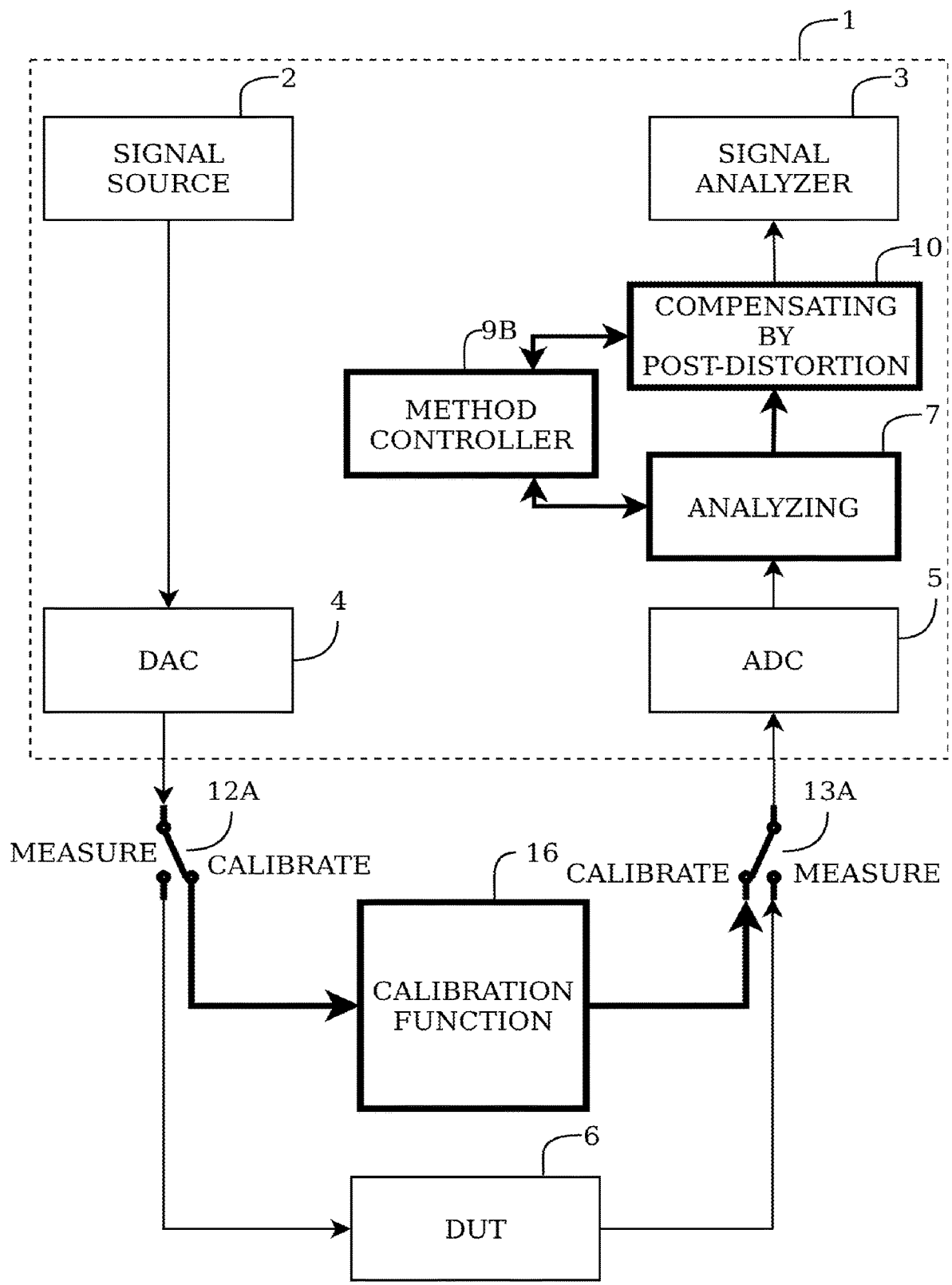

FIG. 3 depicts function involved in compensation of joint harmonic distortions using post-distortion on the ADC side. New functions introduced by the figure are as follows:

9B: A function which controls all functions involved in calibrating, calculating, and compensating joint distortions on the ADC side.

10: A function which post-distorts the digital signal from the ADC 5 with a compensation profile determined by the controller function.

Figure 4:
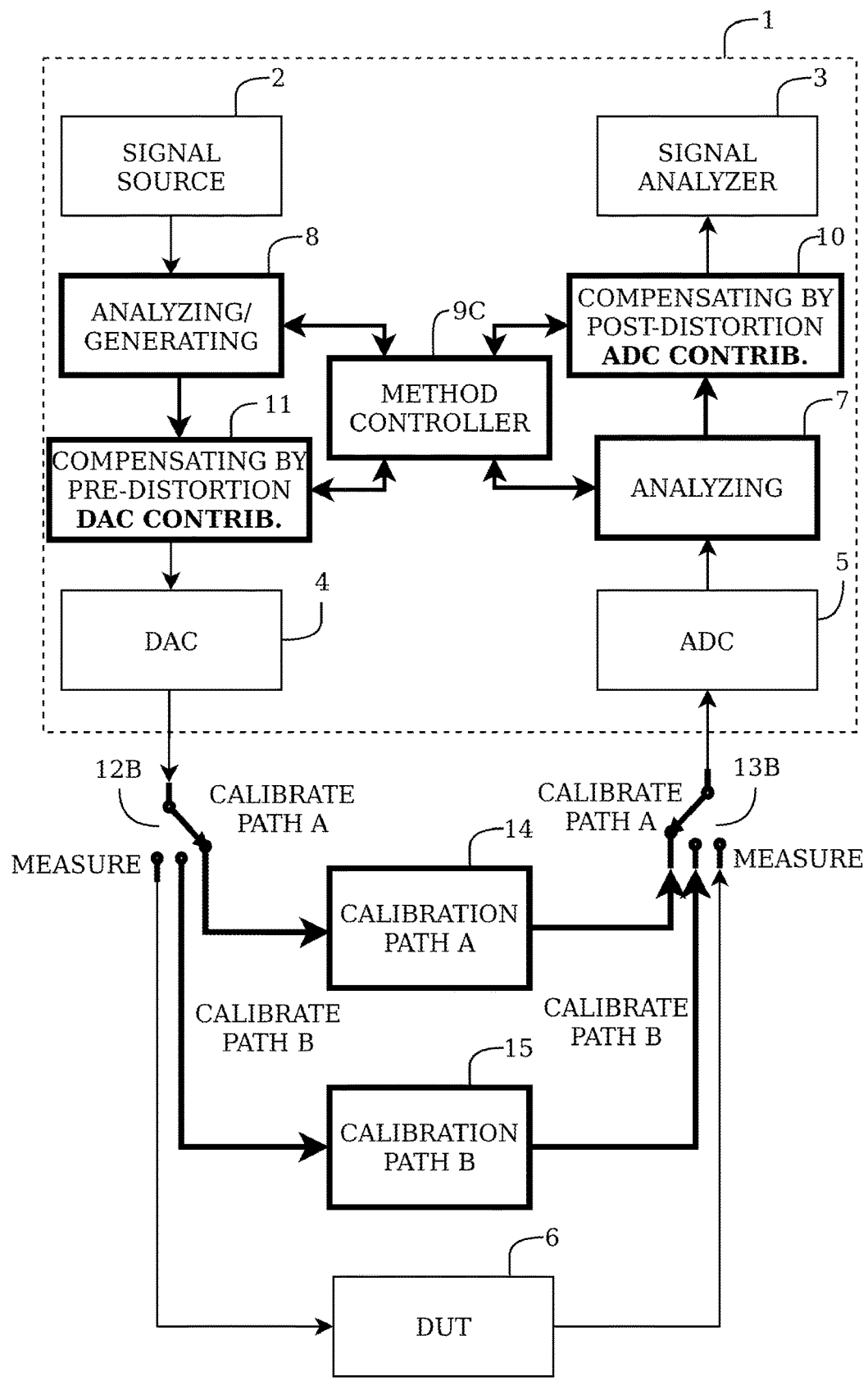

FIG. 4 depicts the embodiment which is able to compensate respective harmonic distortions introduced by the DAC and ADC sides, using two calibration paths. New functions introduced by the figure are as follows:

9C: A function which controls all functions involved in calibrating, calculating, and compensating distortions on the DAC and ADC sides.

12B: A selector function which routes output signal from the DAC 4 to the device-under-test 6 during measurement and to the calibration path 14 or the calibration path 15 during calibration.

13B: A selector function which provides input of the ADC 5 with a signal from output of the device-under-test 6 during measurement and from output of the calibration path 14 or the calibration path 15 during calibration.

14: A calibration path A with minimum harmonic distortion and frequency-dependent phase shift.

15: A calibration path B with minimum harmonic distortions and frequency-dependent phase shift. The phase shift is different from phase shift of the calibration path A 14. The calibration path B is able to attenuate the passing signal at the fundamental frequency to closely similar magnitude as the calibration path A 14.

Figure 5:
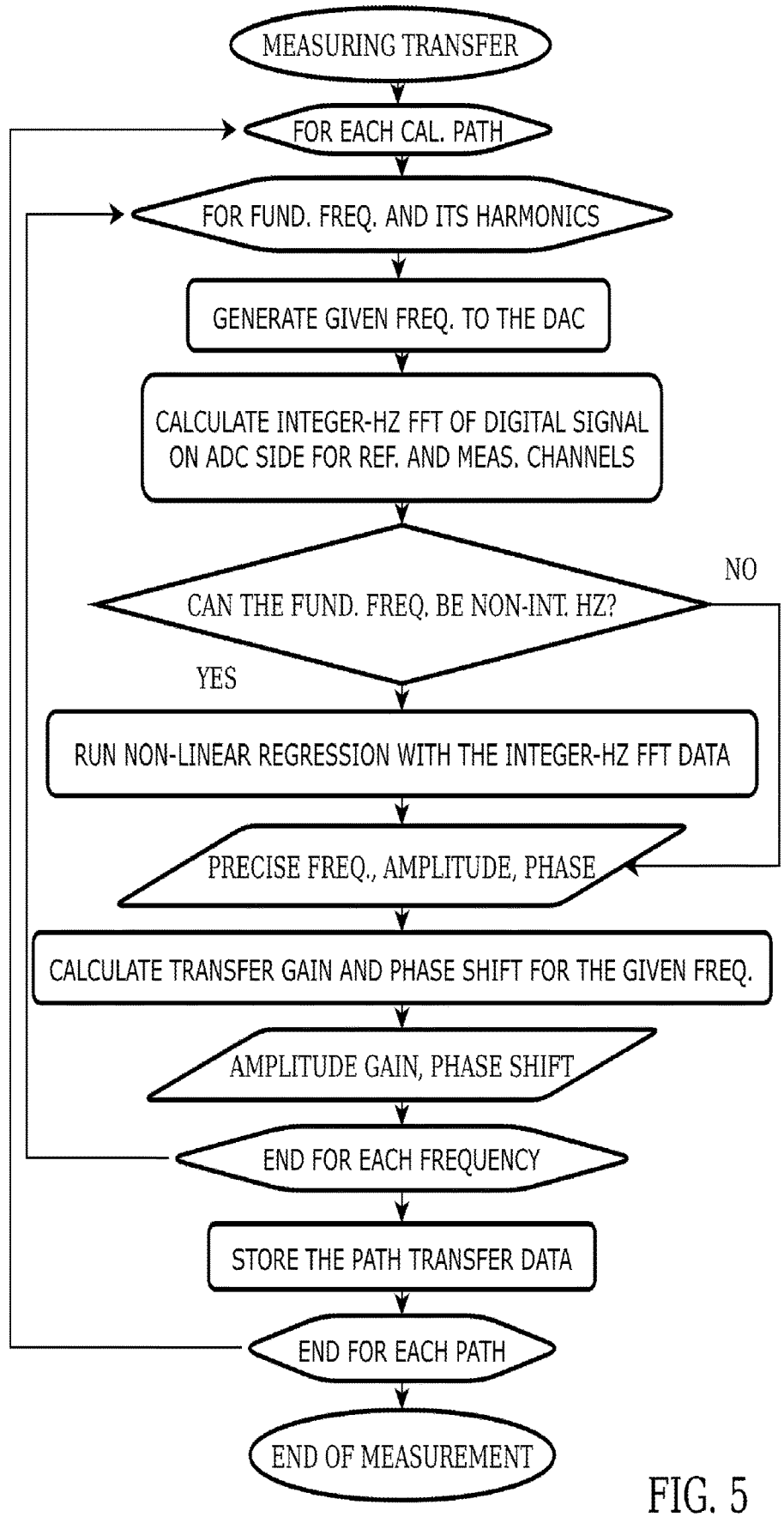

FIG. 5 presents a flow chart detailing procedure of measuring transfer amplitude gain and phase shift of all calibration paths, as described in Step 1.

Figure 6:
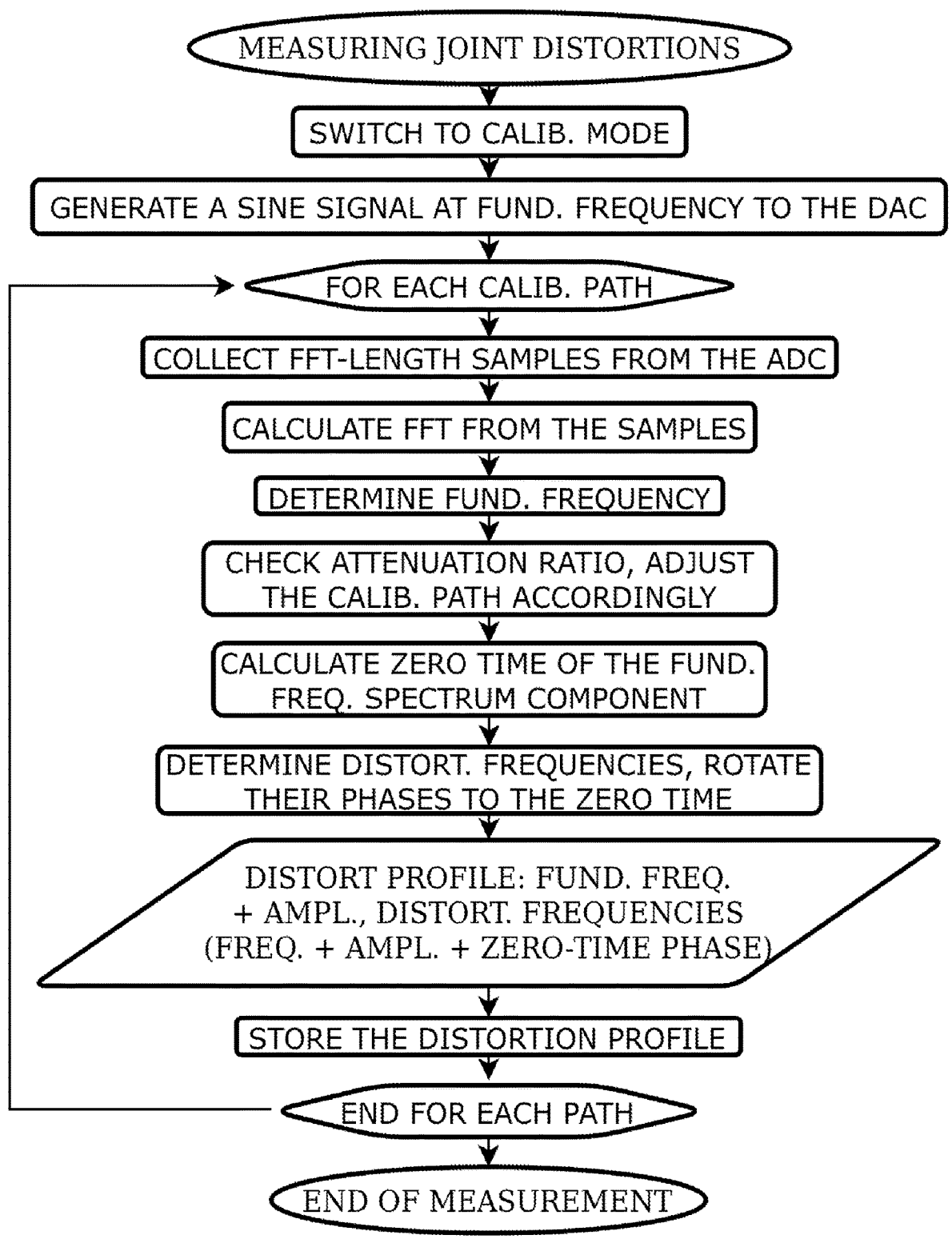

FIG. 6 presents a flow chart detailing procedure of measuring amplitudes and zero-time phases of all joint harmonic distortions for each calibration path, as described in Step 2.

Figure 7A:
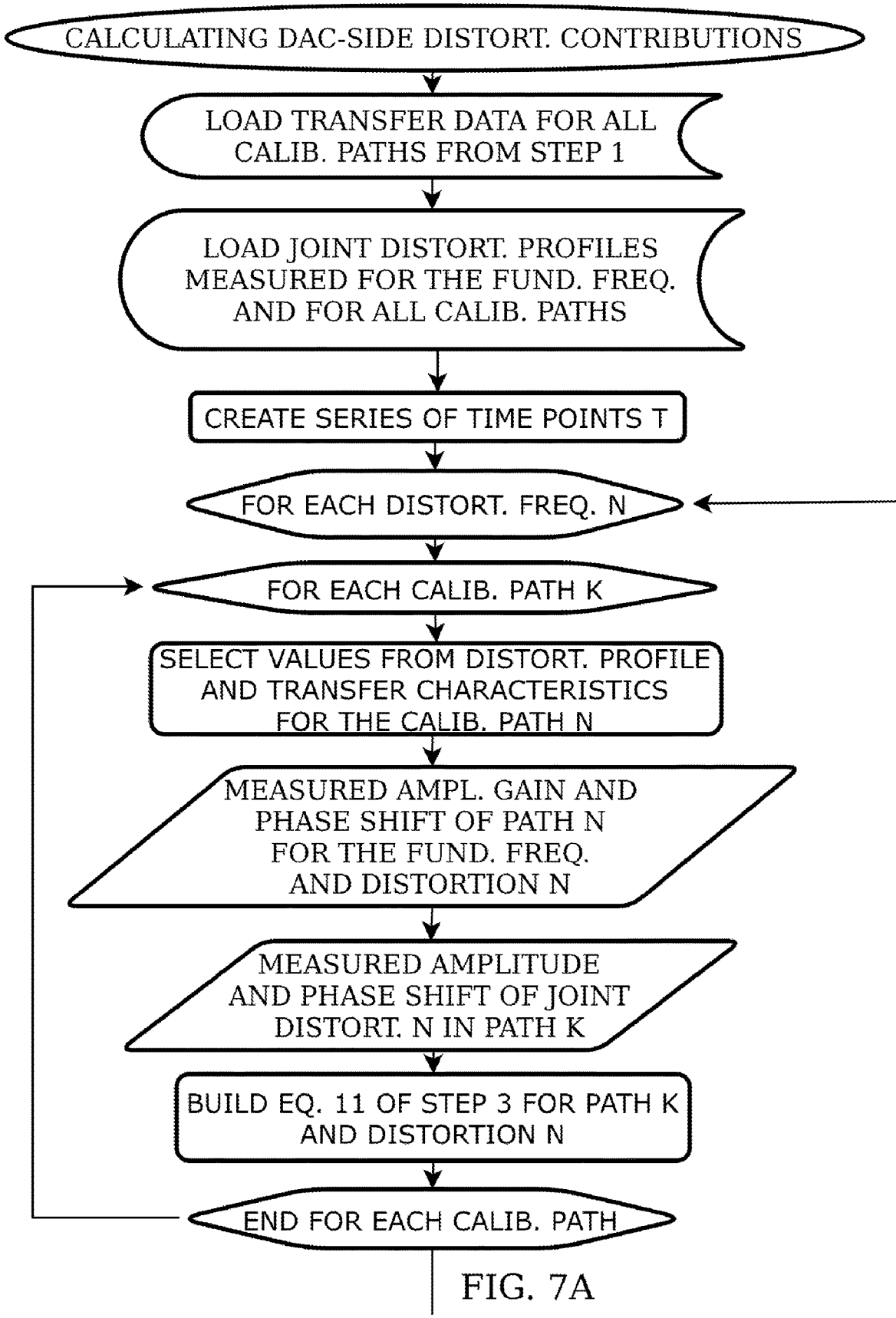
Figure 7B:
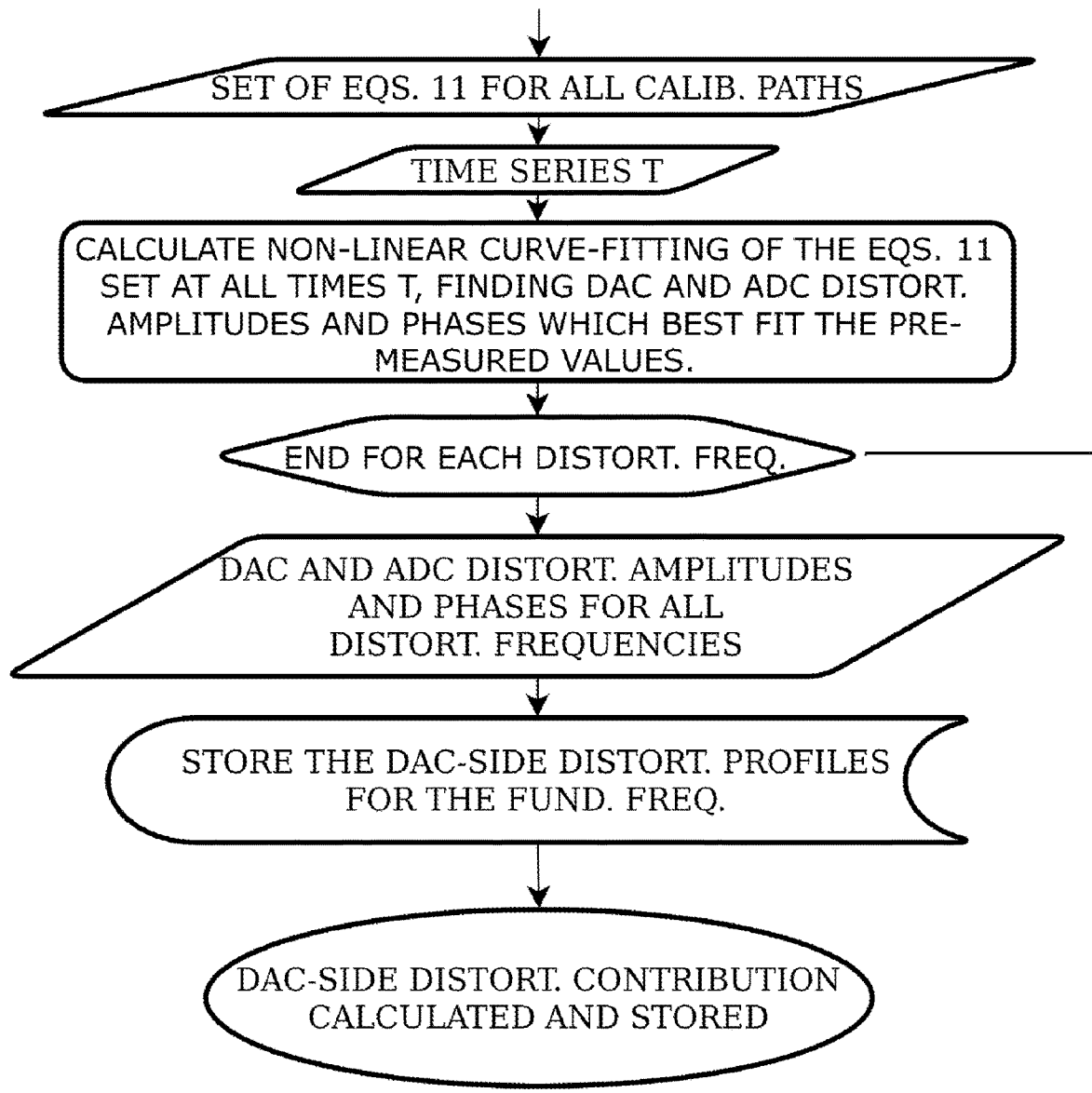

FIG. 7A and FIG. 7B present a flow chart detailing procedure of calculating distortion contributions of the DAC and ADC sides, as described in Step 3.

Figure 8A:
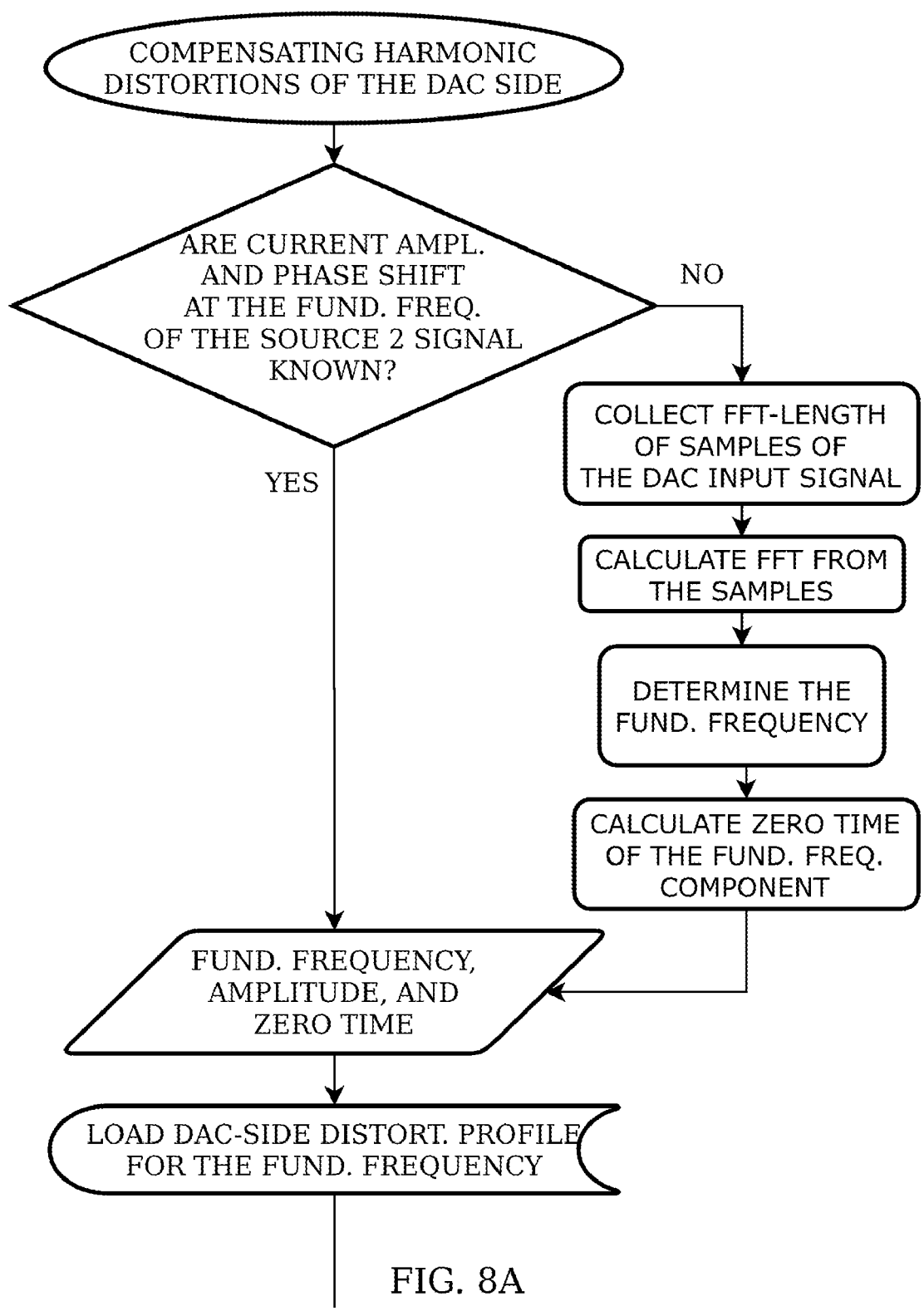
Figure 8B:
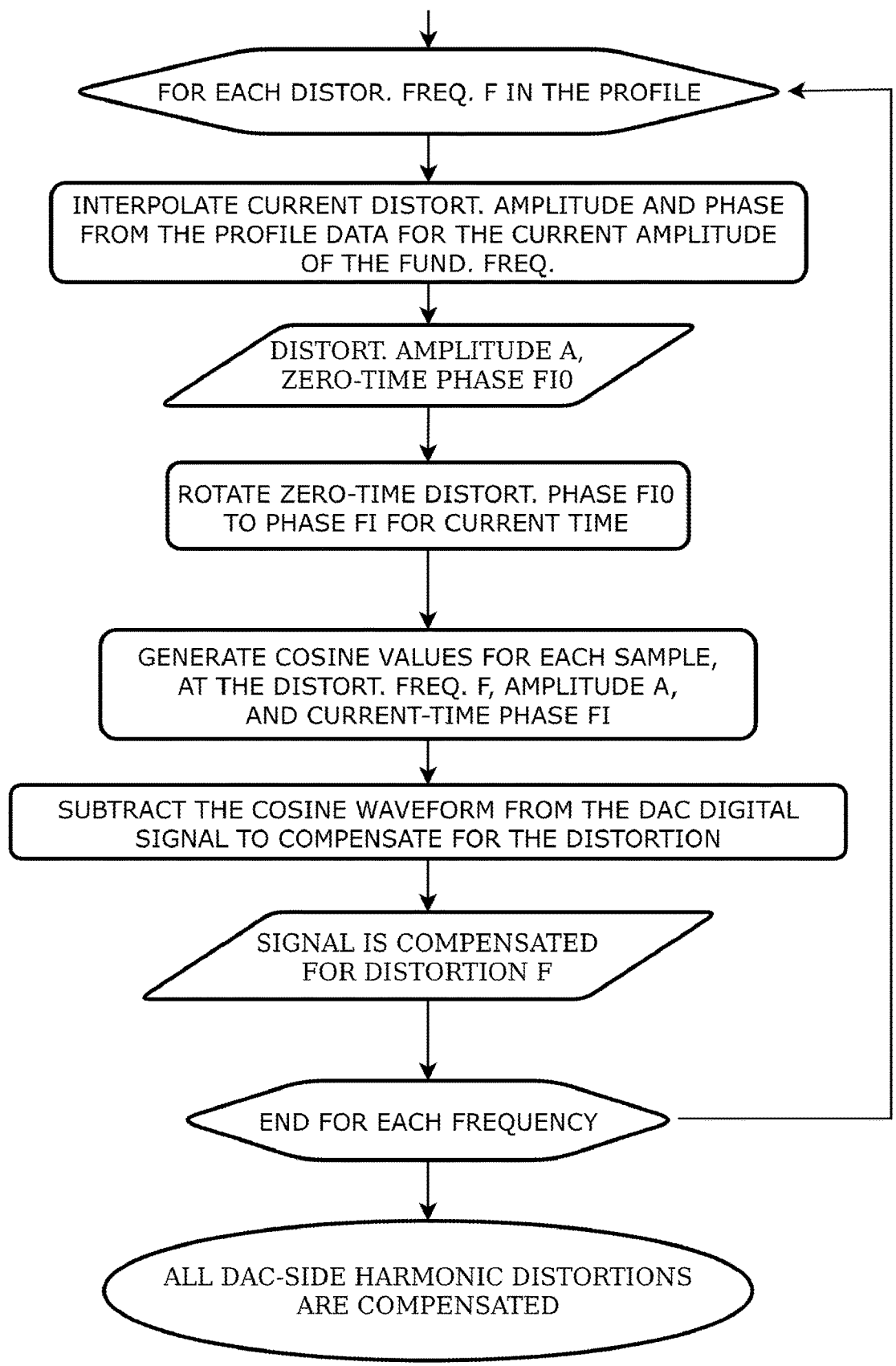

FIG. 8A and FIG. 8B present a flow chart detailing procedure of compensating the DAC-side distortions, as described in Step 4.

Figure 9A:
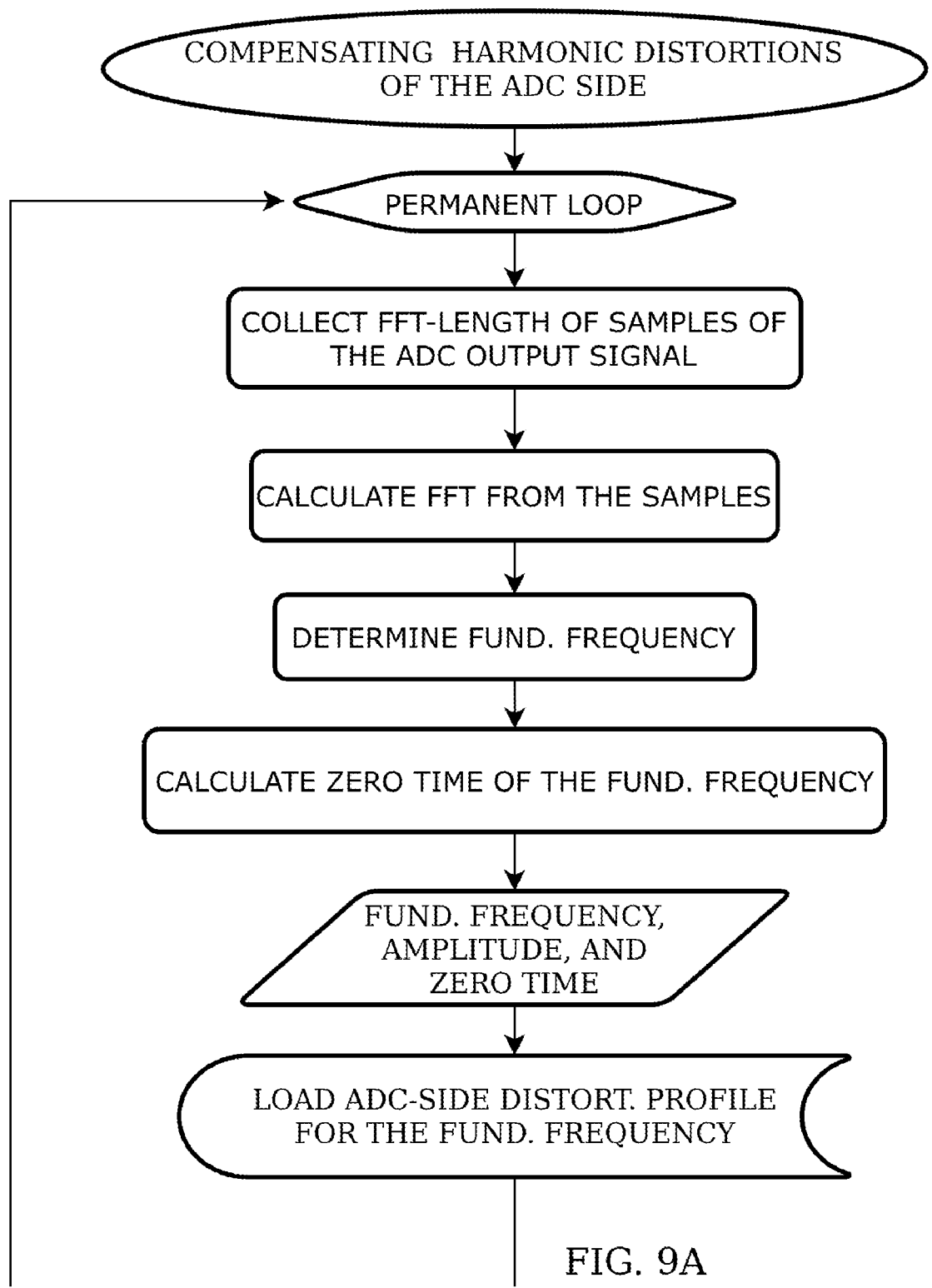
Figure 9B:
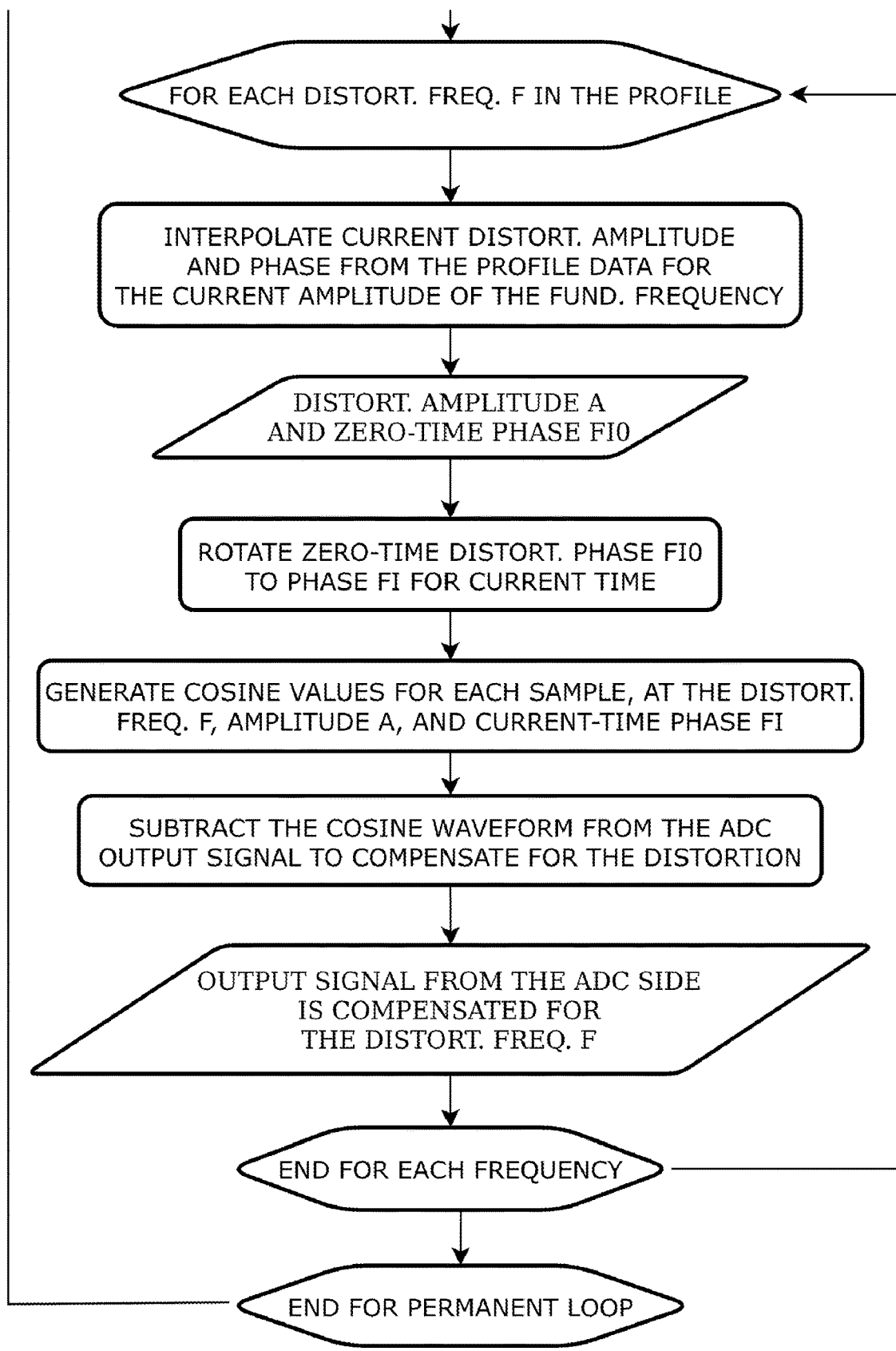

FIG. 9A and FIG. 9B present a flow chart detailing procedure of continually compensating the remaining ADC-side distortions, using a calibration path which has its attenuation ratio adjusted to correspond to the device-under-test output signal, as described in Step 5 and Step 6.

Figure 10:
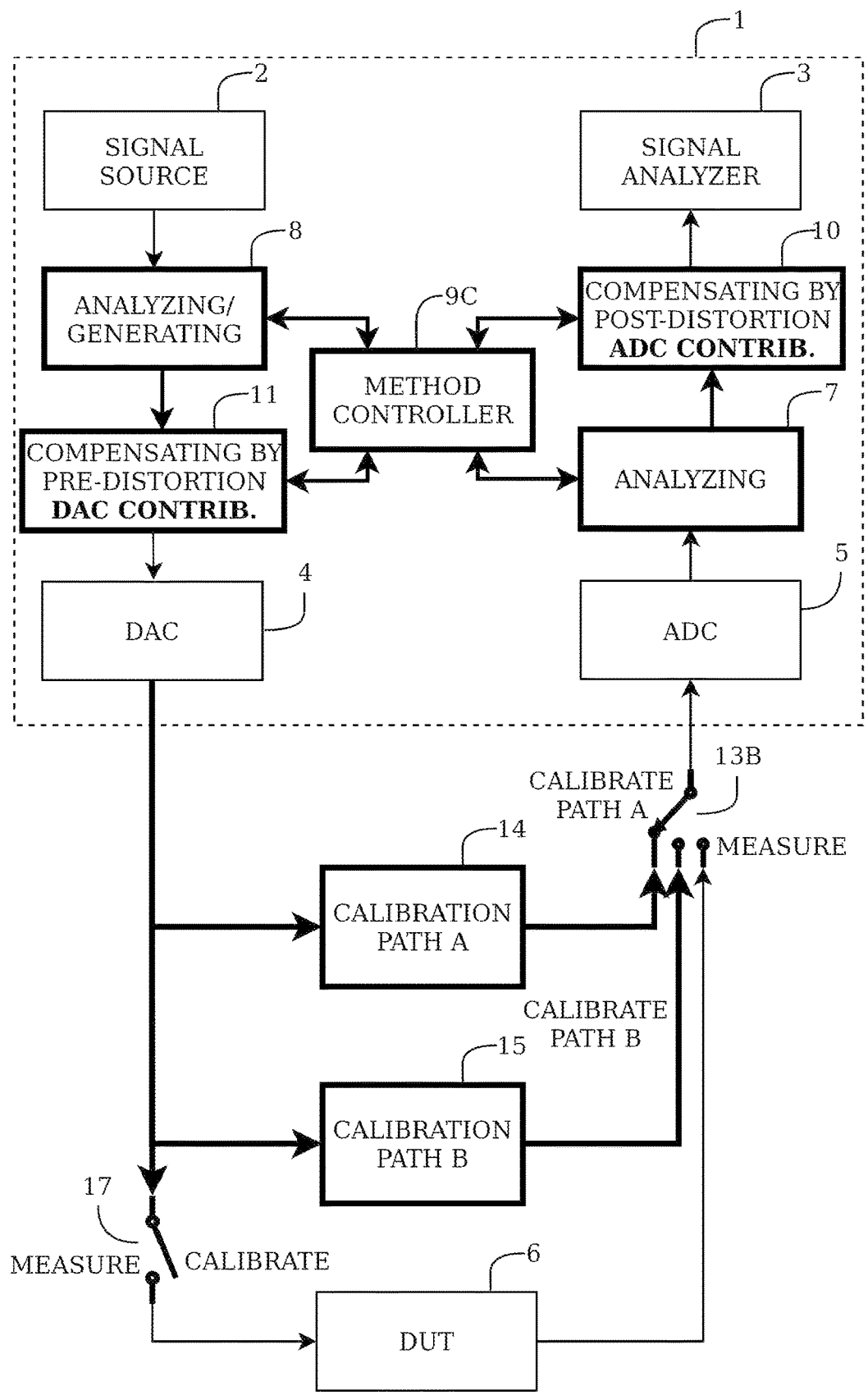

FIG. 10 depicts the embodiment where all analog calibration paths are connected to the DAC output permanently. New functions introduced by the figure are as follows:

17: A connect/disconnect function routing output signal of the DAC 4 to the device-under-test 6 during measurement of the device-under-test, and withholding the signal during measurement of the calibration paths transfer characteristics and during calibration of the DAC and ADC distortions.

Figure 11:
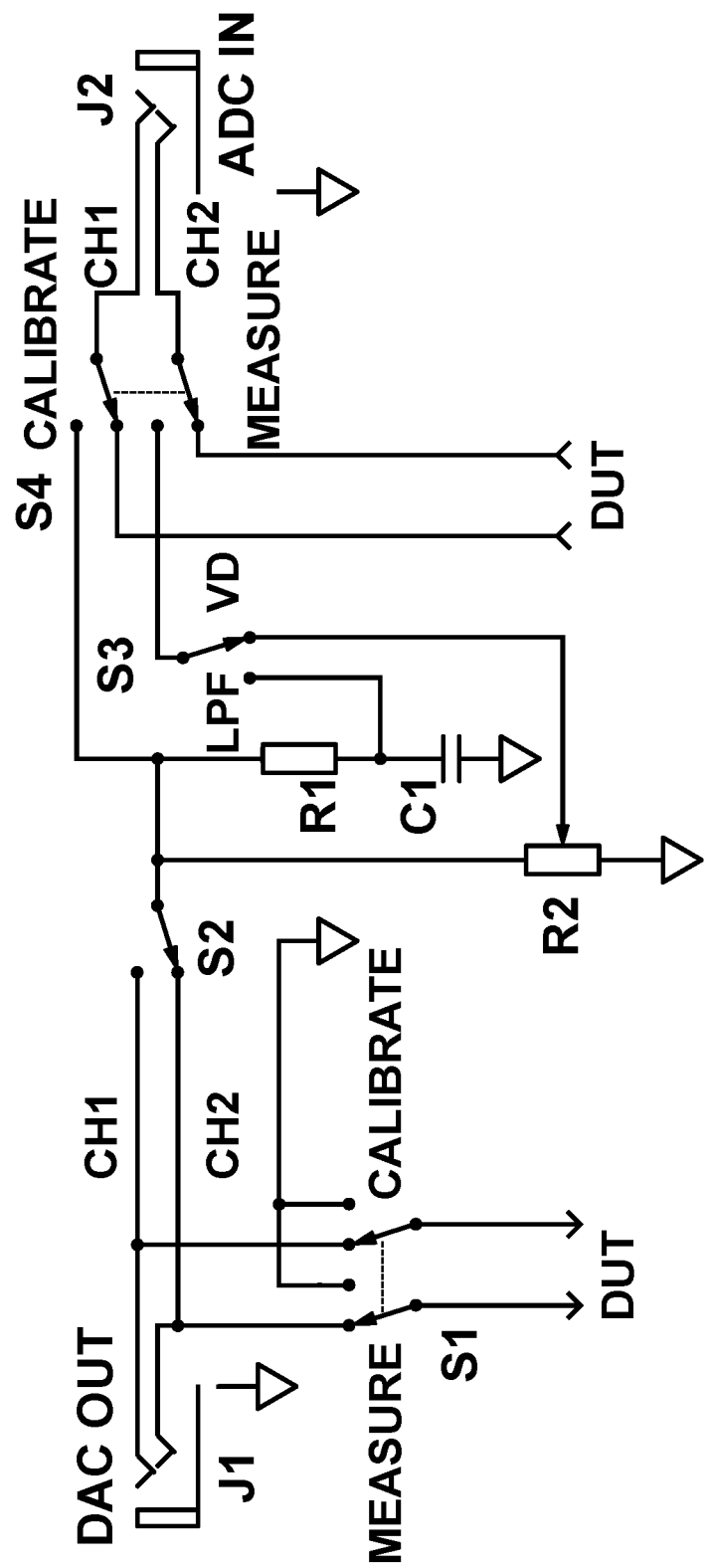

FIG. 11 depicts a circuit diagram of the calibration paths of the embodiment which has the analog signal transferred by electricity, using a first-order RC low-pass filter as the calibration path A 14 and a voltage divider as the path calibration B 15. Key components on the figure are as follows:

J1: Output terminal of the DAC 4. This embodiment supports two DAC channels, but other embodiments can support any number of DAC channels.

S1: A switch selecting input signal to the device-under-test 6 in measurement and calibration modes. In calibration mode all inputs of the device-under-test are shorted to ground. In measurement mode the inputs are connected to the DAC 4 output. The switch S1 embodies the connect/disconnect function 17.

S2: A switch selecting which output channel of the DAC 4 is to be be calibrated.

S3: A switch selecting calibration signal from two calibration paths: (1) a low-path RC filter embodying the calibration path A 14 and (2) a voltage divider embodying the calibration path B 15. Both calibration path circuits are permanently connected to DAC output in order to keep operating conditions of the DAC fixed.

S4: A switch selecting input signal for the ADC 5 in measurement and calibration modes. In measurement mode the switch S4 connects outputs of the device-under-test 6 to inputs of the ADC 5. In calibration mode one input channel (reference channel) of the ADC 5 receives signal directly from output of the DAC 4, while the another input channel of the ADC 5 receives signal from one of the calibration paths. The switches S3 and S4 together embody the selector 13.

R1, C1: Components of the low-pass RC filter which embodies the calibration path A 14.

R2: A resistor voltage divider which embodies the calibration path B 15.

J2: Input terminals of the ADC 5.

Figure 12:
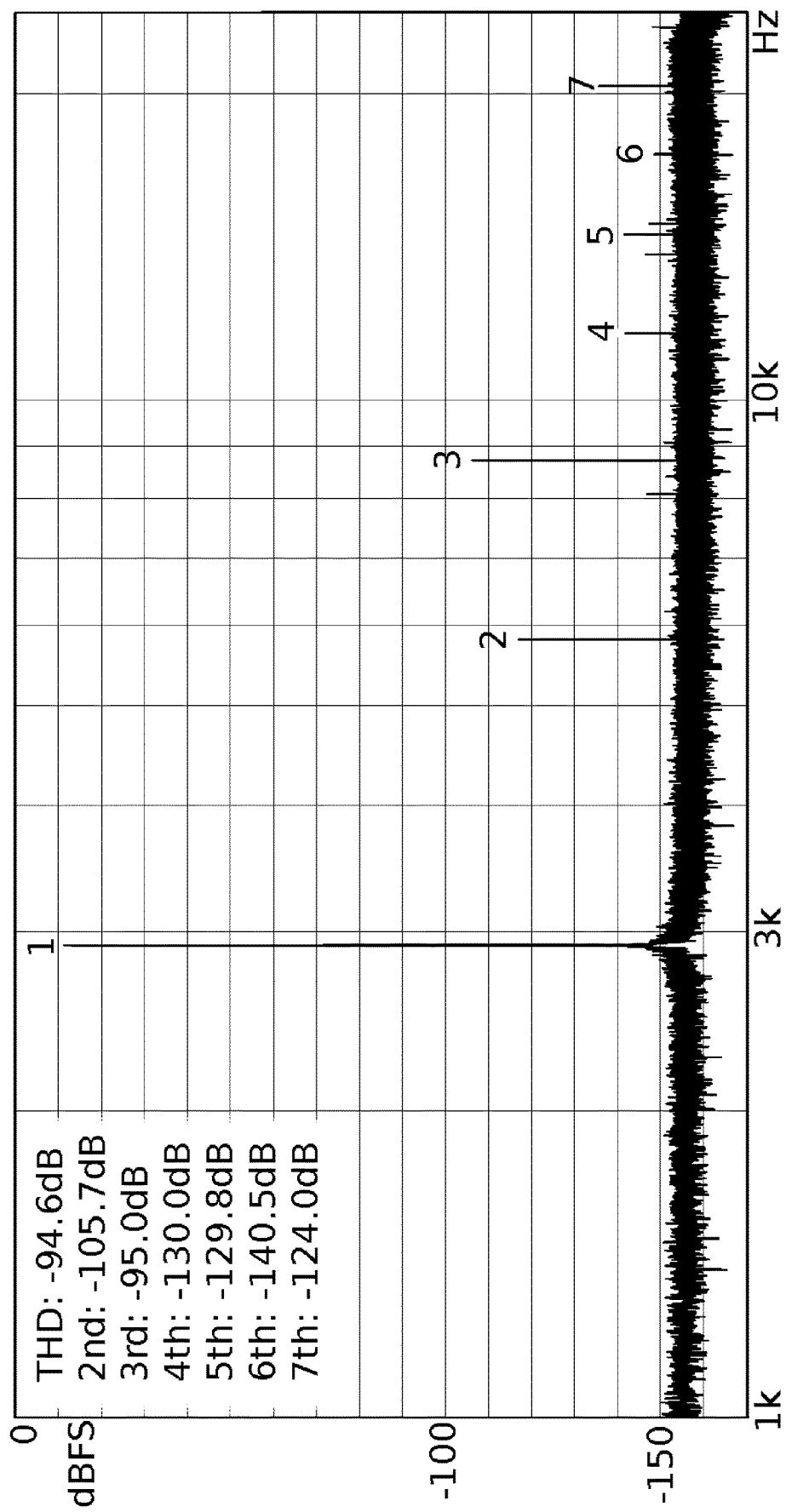

FIG. 12 shows a frequency spectrum chart measured in the example implementation Impl. 1. A sine signal of frequency 2,911 Hz was passing through the voltage divider calibration path. No compensation was being performed. Spectrum peaks corresponding to the fundamental frequency and its distortion harmonics are marked with numbers, distortion amplitudes are listed in the upper-left corner of the screenshot.

Figure 13:
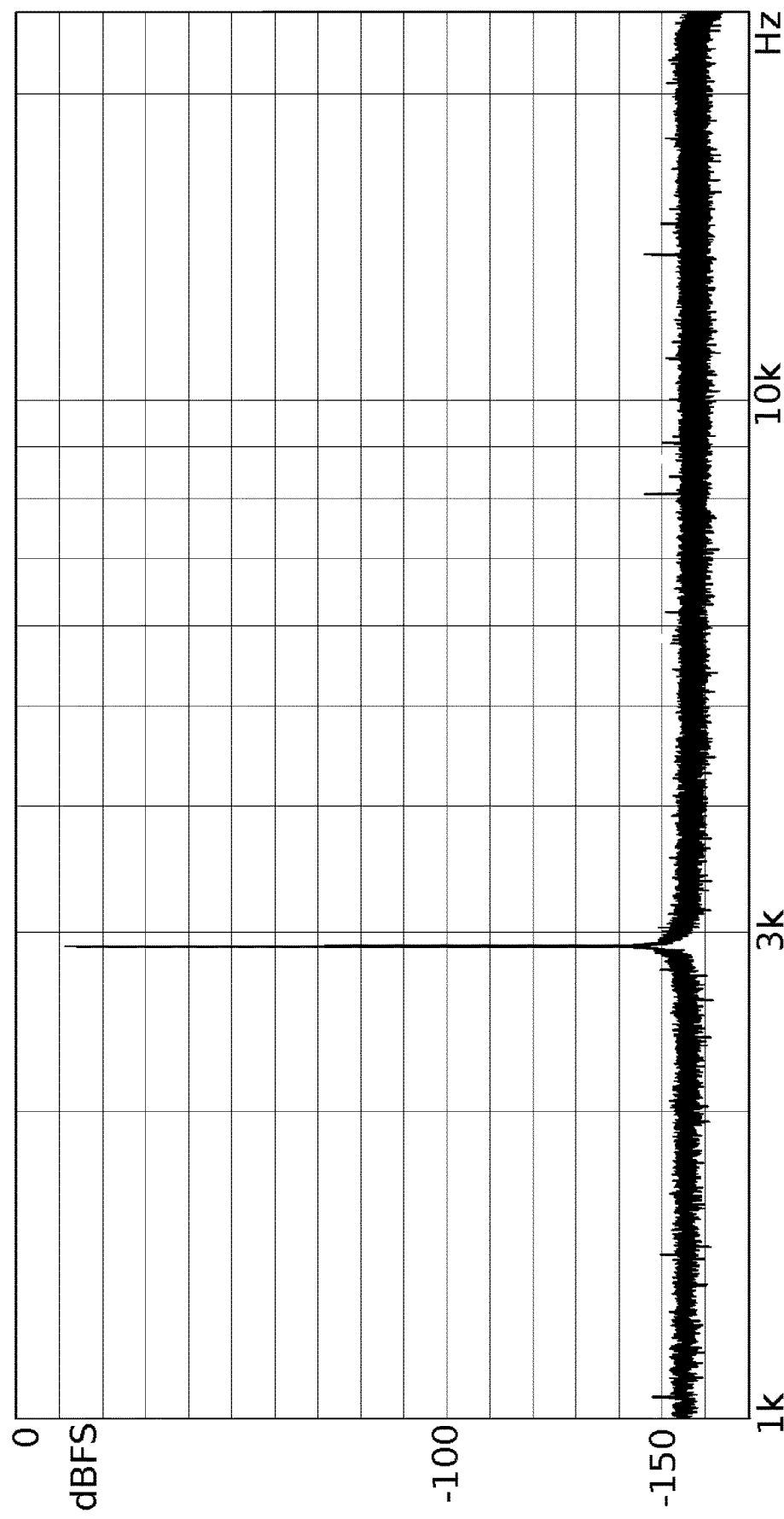

FIG. 13 shows a frequency spectrum chart measured within the same implementation and the same sine signal provided by the source 2 as in FIG. 12. The analog signal was passing through the voltage divider calibration path. The DAC-side distortions were compensated on the DAC side by Steps 1 to 4 and the remaining ADC-side distortions compensated on the ADC side by Steps 5 and 6. All the harmonic distortions measured by the analyzer 3 were reduced close to noise level.

Figure 14:
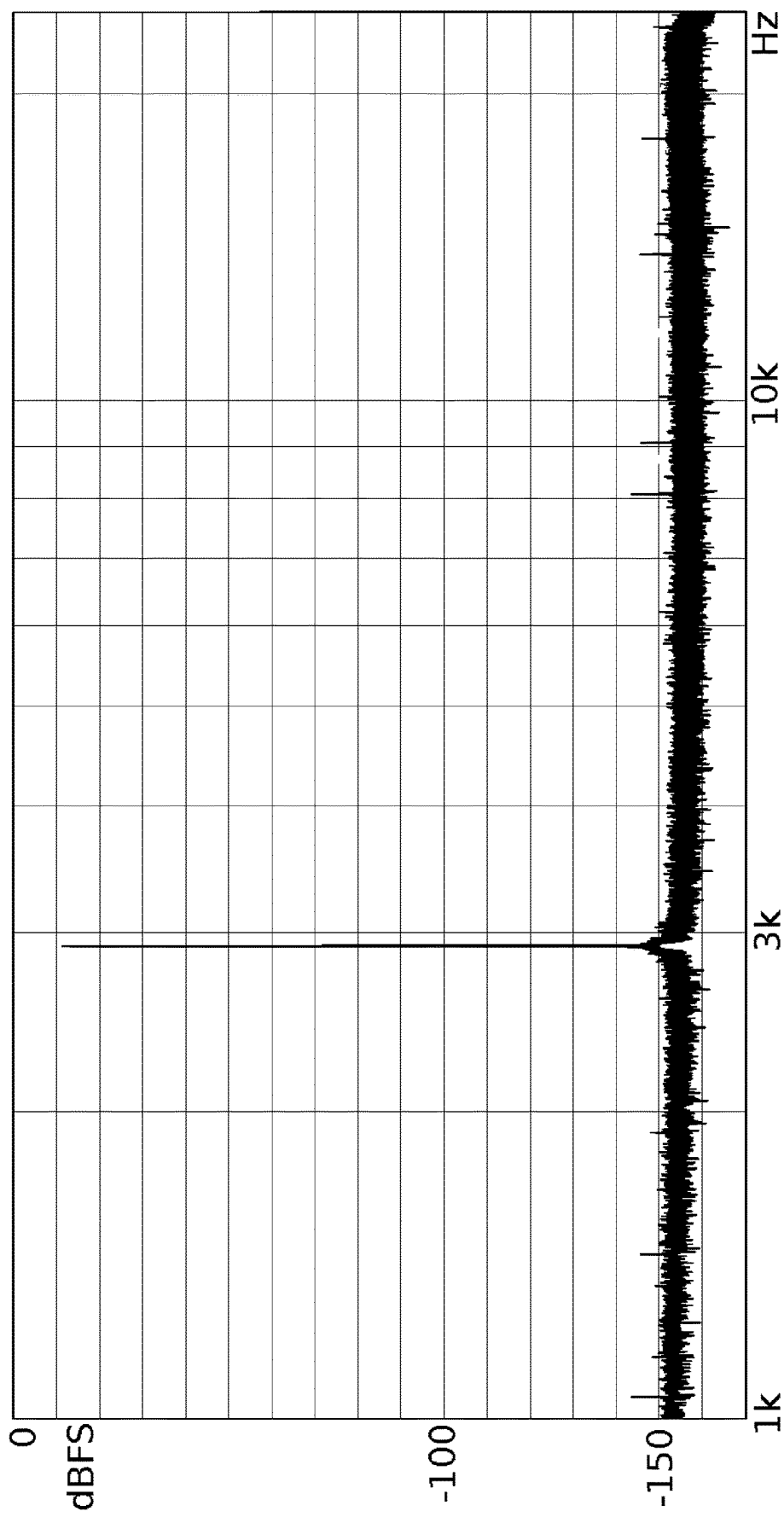

FIG. 14 shows a frequency spectrum chart measured within the same implementation and the same sine signal provided by the source 2 as in FIG. 12 and FIG. 13. The analog signal was passing through the low-pass filter calibration path. The DAC-side distortions were compensated on the DAC side by Steps 1 to 4. The ADC side distortions were calibrated in Step 5 when the signal was passing through the voltage divider calibration path, and the obtained distortion profile for the ADC side was being compensated on the ADC side by Step 6.

Figure 15:
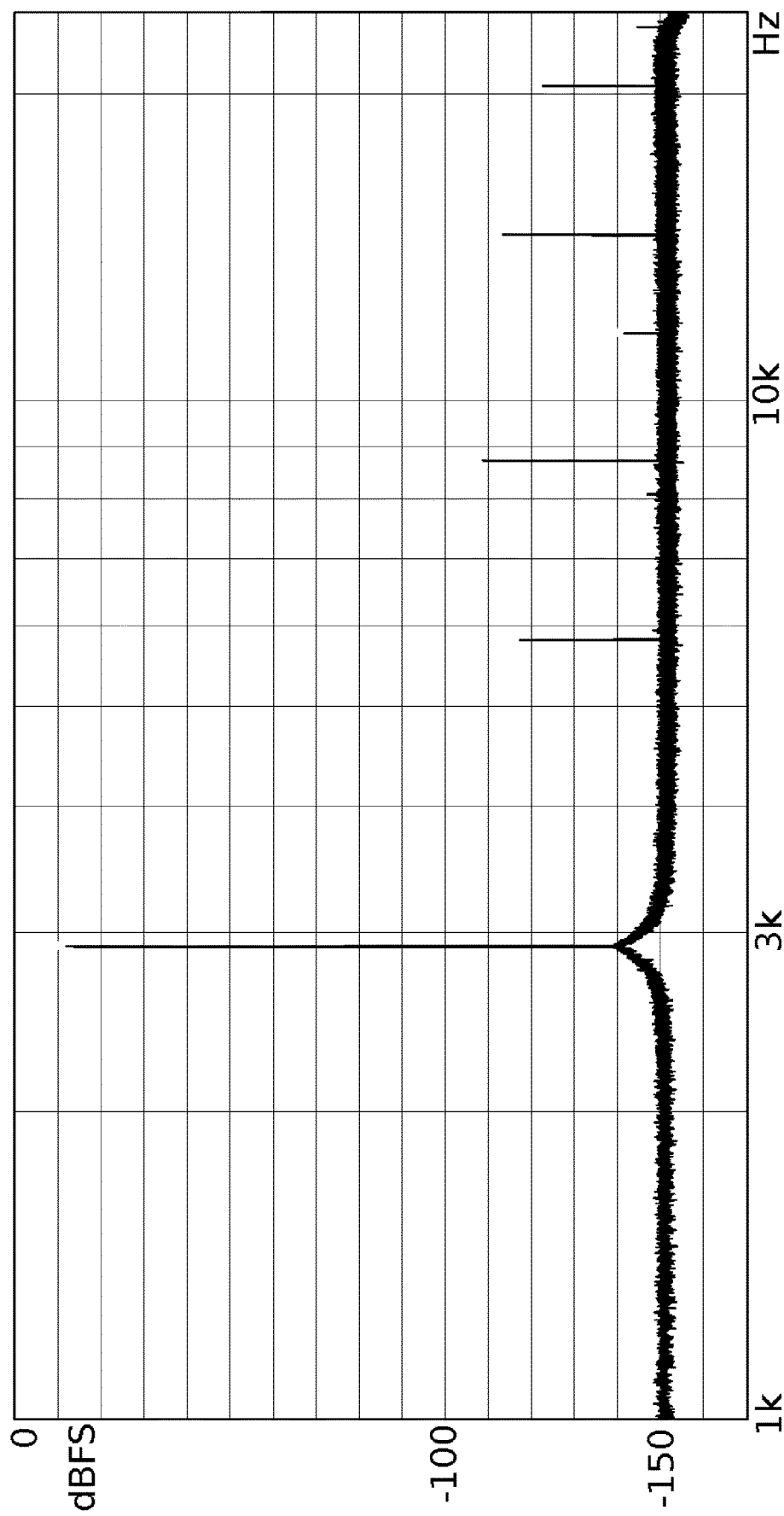

FIG. 15 shows a frequency spectrum chart measured in the example implementation Impl. 2 which used independently clocked DAC 4 and ADC 5. A sine signal of frequency 2,911 Hz was passing through the voltage divider calibration path. The independent clocks of the DAC and ADC caused that the analyzing function 7 measured frequency of the signal on the ADC side at 2,911.040 Hz. No compensation was being performed.

Figure 16:
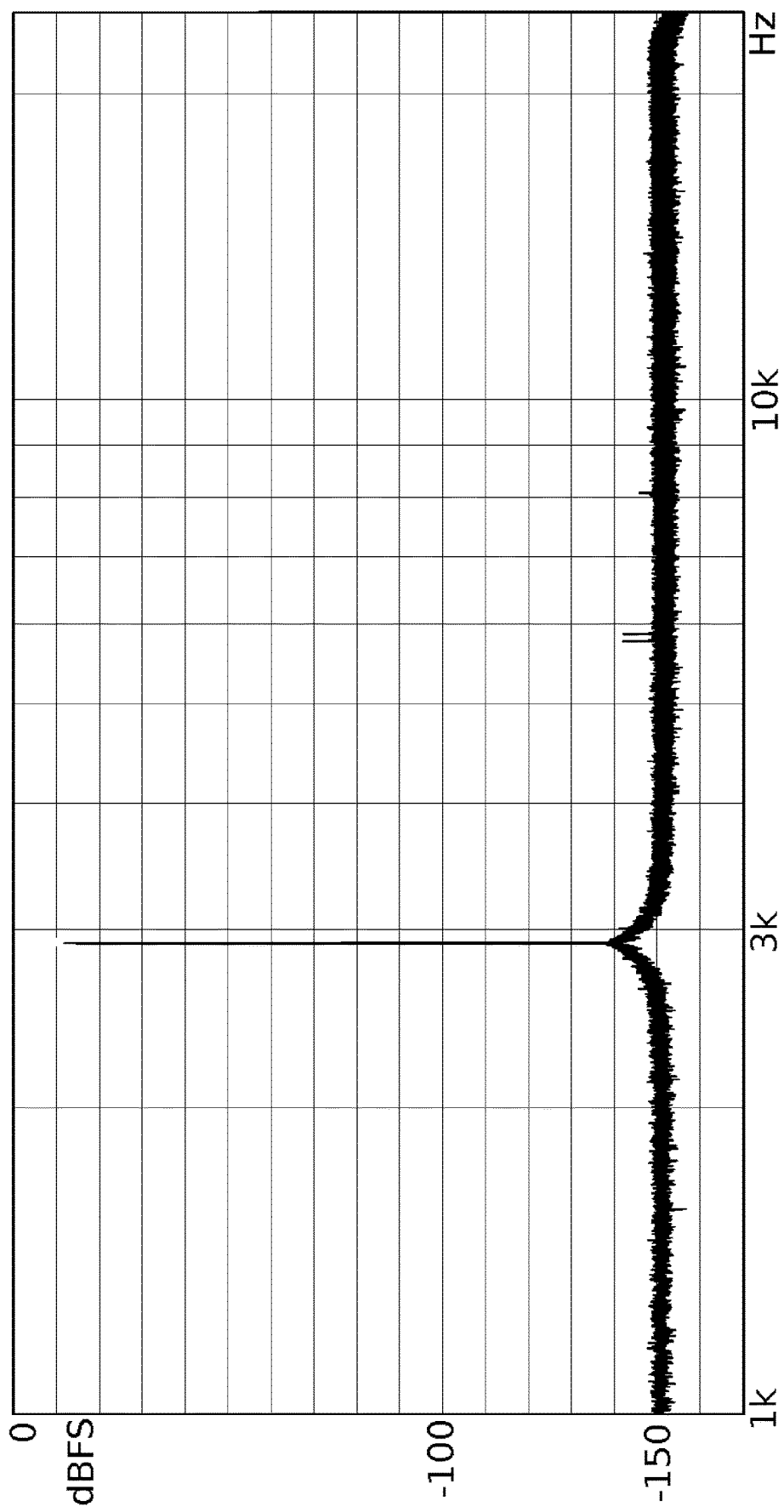

FIG. 16 shows a frequency spectrum chart measured within the same implementation and the same sine signal provided by the source 2 as in FIG. 15. The analog signal was passing through the voltage divider calibration path. The DAC-side distortions were compensated on the DAC side by Steps 1 to 4, and the remaining ADC-side distortions were compensated on the ADC side by Steps 5 and 6. All the harmonic distortions (integer-Hz frequency on DAC side, non-integer-Hz frequency on the ADC side) were reduced close to noise level.

Figure 17:
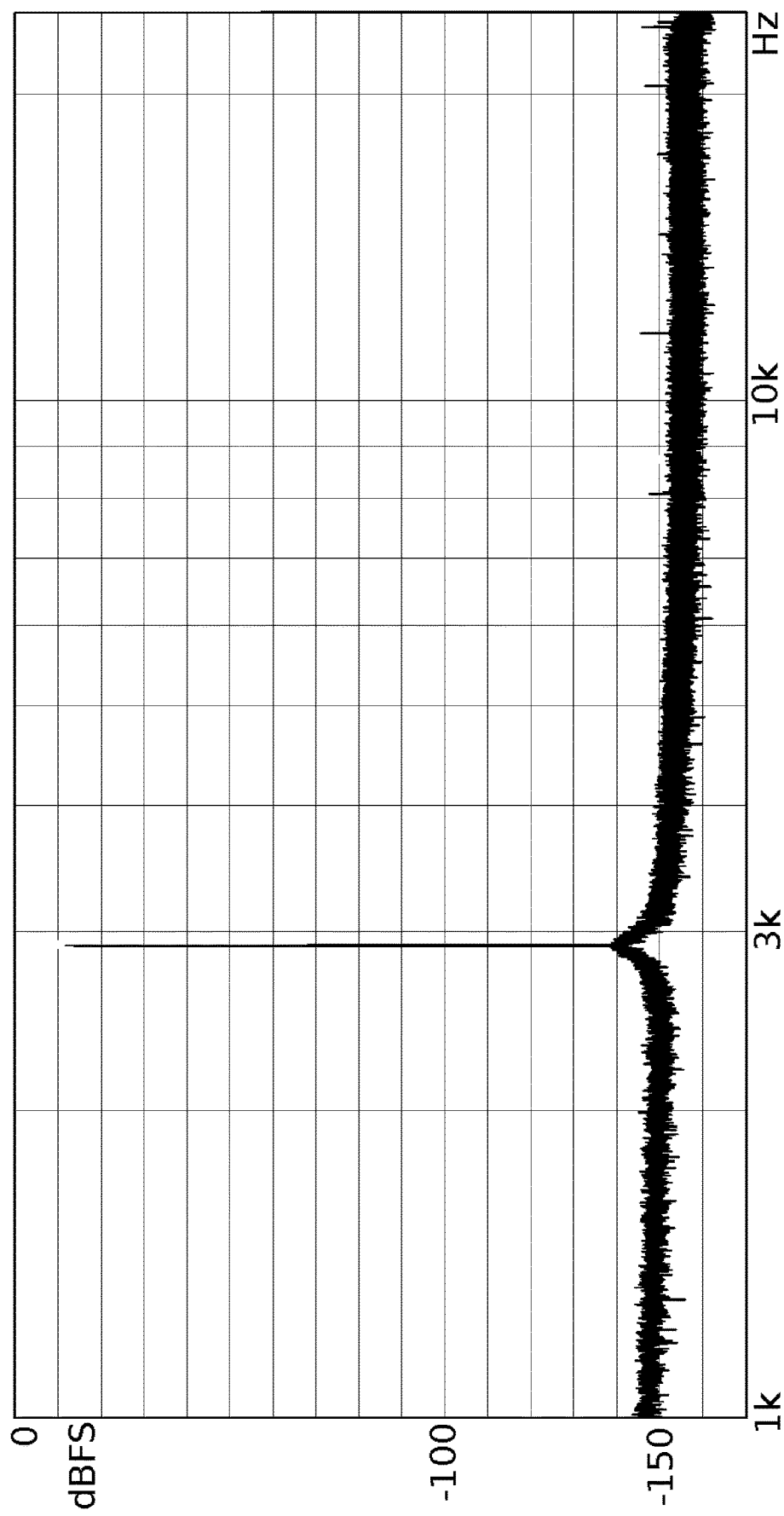

FIG. 17 shows a frequency spectrum chart measured within the same implementation and the same sine signal provided by the source 2 as in FIG. 15 and FIG. 16. The analog signal was passing through the low-pass filter calibration path. Distortions caused by the DAC side were compensated on the DAC side by Steps 1 to 4. The ADC side distortions were calibrated in Step 5 when the signal was passing through the voltage divider calibration path, and those ADC distortions were being compensated on the ADC side by Step 6.

Figure 18:
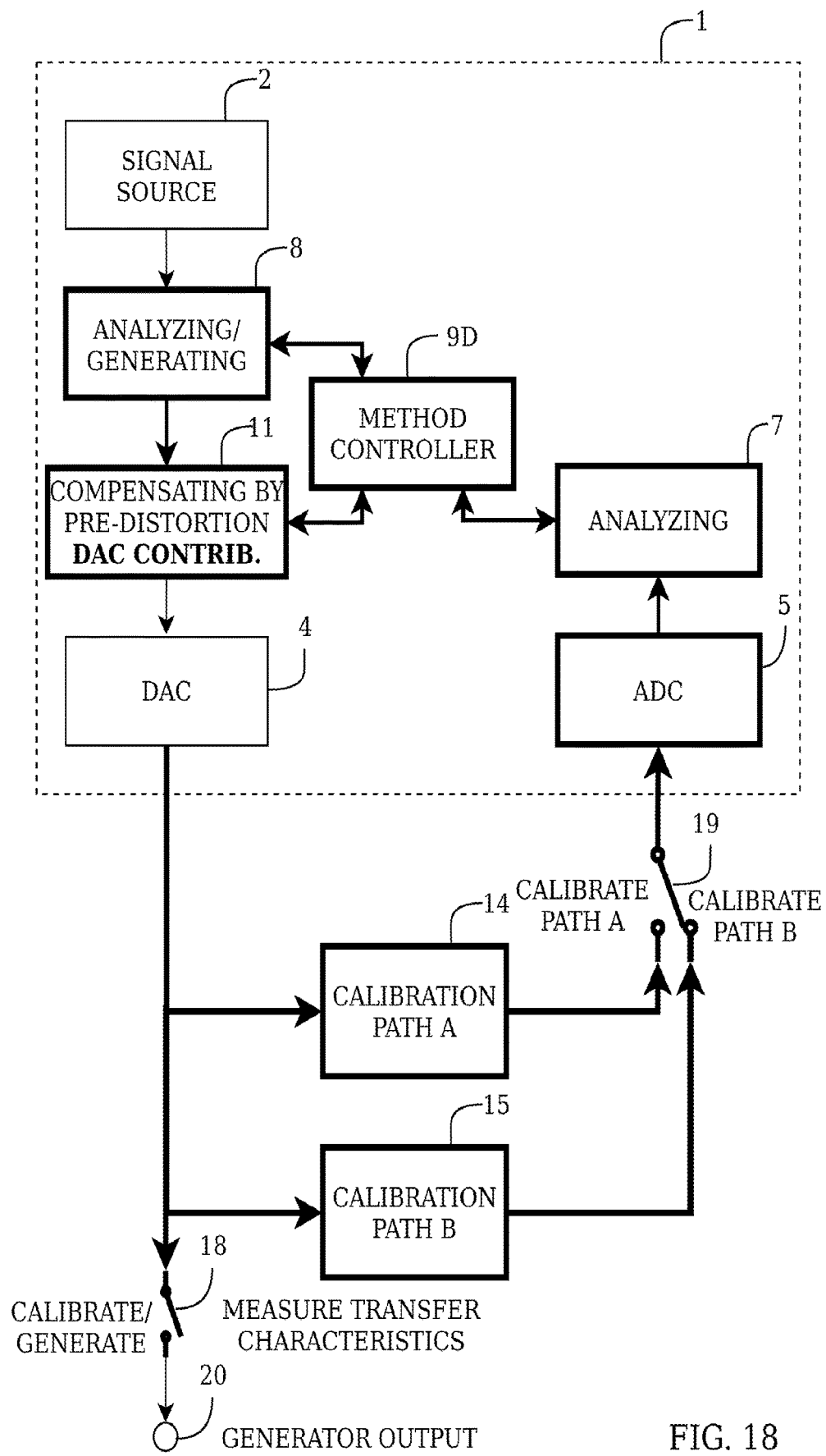

FIG. 18 depicts the embodiment which creates a harmonic signal generator with continually compensated harmonic distortions. New functions introduced by the figure are as follows:

18: A connect/disconnect function preventing the DAC 4 output signal from reaching the generator output 20 when transfer parameters of the two calibration paths are measured, that is when the DAC 4 outputs a signal different from the signal generated by the source 2 during measurement.

19: A selector function providing input of the ADC 5 with signal from the calibration path A 14 or from the calibration path B 15.

20: Output of the harmonic signal generator

Figure 19A:
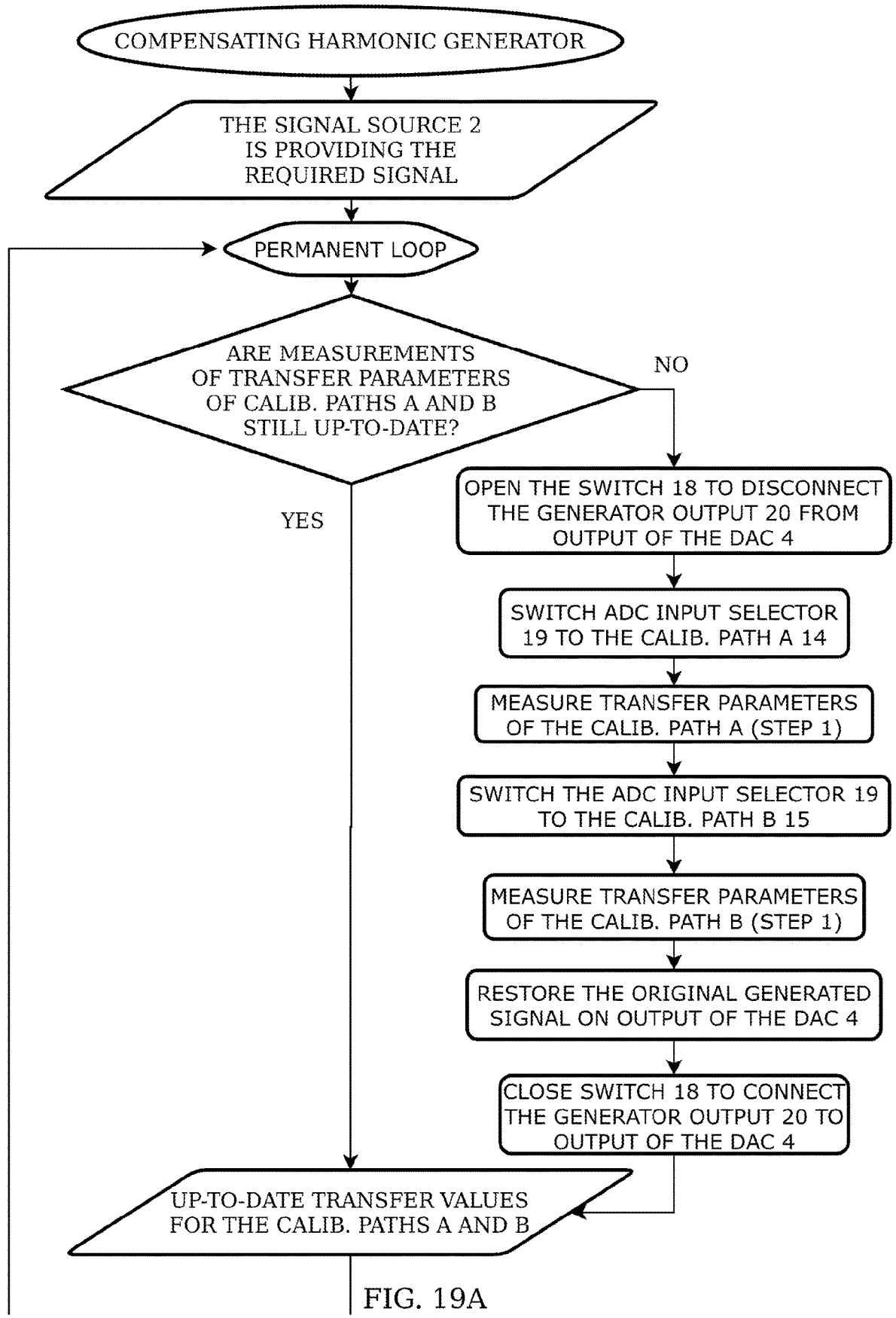
Figure 19B:
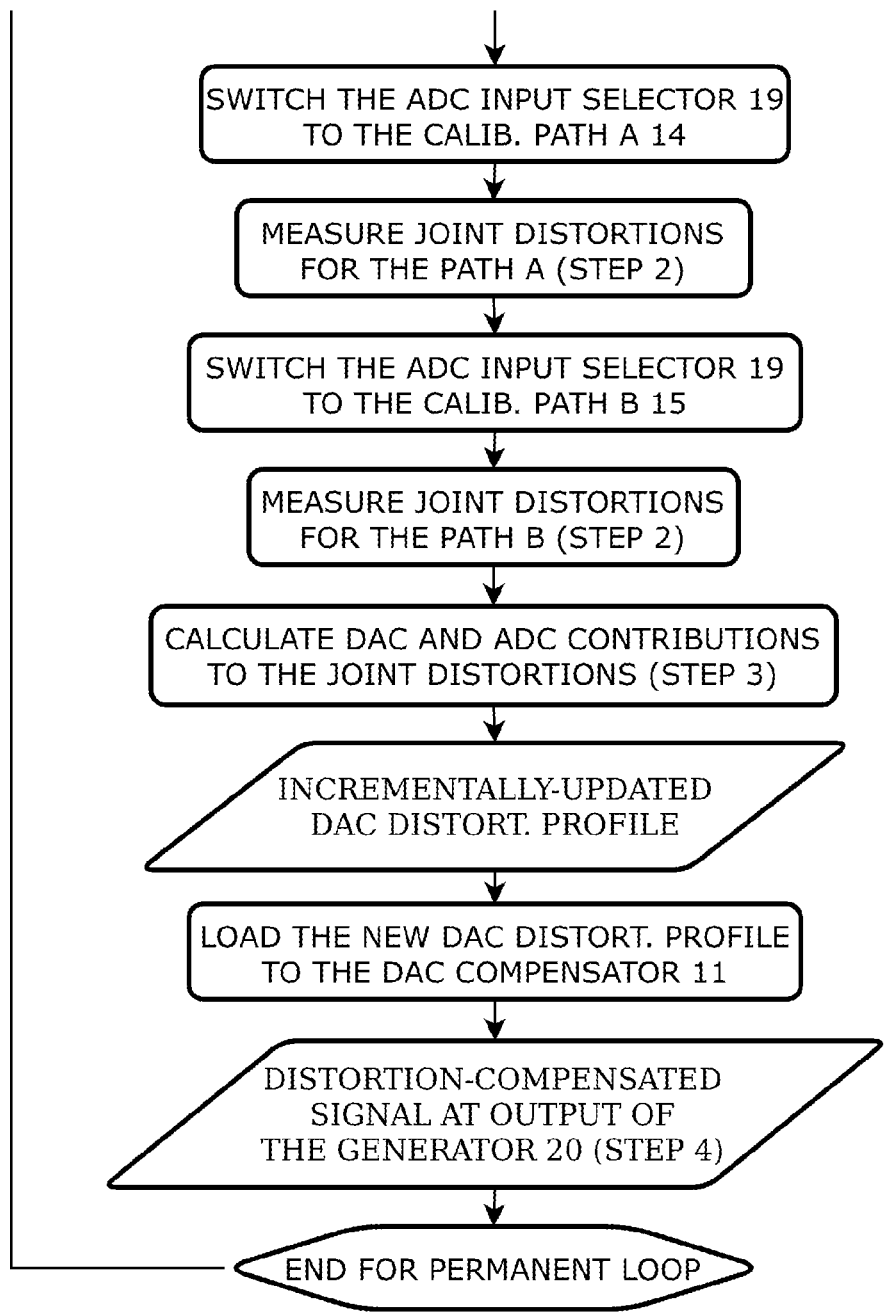

FIG. 19A and FIG. 19B present a flow chart detailing procedure of the embodiment depicted in FIG. 18.

FIG. 20 lists distortions measured at output 20 of the harmonic generator with continually compensated harmonic distortions as embodied by the implementation Imp. 3. The first column lists index of the distortion harmonic frequency detailed by each row. The second column lists distortion amplitudes relative to fundamental frequency amplitude measured at output 20 for uncompensated distortions of the DAC 4. The third column lists distortion amplitudes relative to fundamental frequency amplitude measured with the continual compensation of the DAC-side distortions. The last column lists reduction in the distortion levels achieved by the compensation.

I claim:

1. A method for determining amplitudes and phase shifts of nonlinear harmonic distortions introduced by a digital to analog converter, comprising:
    (a) providing a source of a digital signal such that said source is able to provide a precise sine signal at a predetermined fundamental frequency;
    (b) providing a digital to analog converter which is able to convert said digital signal to a continuous analog signal;
    (c) providing a plurality of calibration paths such that
        nonlinear distortion of each said calibration path is lower than a predetermined maximum residuum,
        each said calibration path attenuates a passing sine fundamental signal, at said fundamental frequency, by a ratio which differs from a ratio, by which every other calibration path from said plurality of calibration paths attenuates said passing sine fundamental signal, by less than a predetermined maximum difference,
        and each said calibration path shifts phase of a passing sine distortion signal, with frequency above said fundamental frequency, by a value which differs from a value, by which every other calibration path from said plurality of calibration paths shifts phase of said passing sine distortion signal, by more than a predetermined minimum difference;
    (d) connecting input of each said calibration path to output of said digital to analog converter;
    (e) providing an analog to digital converter which is able to convert a continuous analog signal to a series of digital samples representing a digital form of the analog signal;
    (f) connecting input of said analog to digital converter to output of each said calibration path selectively;
    (g) providing a memory configured to store at least executable instructions;
    (h) providing one or more processors, coupled to at least said memory, the digital input of said digital to analog converter, and the digital output of said analog to digital converter, configured to execute the executable instructions to at least:

determine, sequentially for every combination of one calibration path selected from said plurality of calibration paths and of one frequency selected from frequencies comprising said fundamental frequency and its predetermined harmonic frequencies, attenuation and phase shift at said selected frequency, as introduced by said selected calibration path, using said digital to analog converter to convert a precise digital sine signal, generated at said selected frequency, to analog representation of the signal, and using said analog to digital converter to convert the analog signal from output of said selected calibration path to digital representation of the signal, determine, sequentially for every calibration path selected from said plurality of calibration paths, amplitude of said fundamental frequency and amplitude and phase shift of every predetermined harmonic frequency of said fundamental frequency contained in frequency spectrum of a digital signal produced by said analog to digital converter, using said digital to analog converter to convert a digital sine signal, generated at said fundamental frequency and with a predetermined fundamental amplitude, to analog representation of the digital signal, and using said analog to digital converter to convert the analog signal, produced by said selected calibration path, to the digital signal, calculate, sequentially for every predetermined harmonic distortion frequency of said fundamental frequency, values of unknown variables which solve, up to a predetermined precision, a system of mathematical equations in which every equation describes transfer characteristics of one said calibration path and in which the unknown variables stand for distortion frequency amplitude and phase shift introduced by said digital to analog converter at said predetermined harmonic distortion frequency;

whereby amplitudes and phase shifts of nonlinear harmonic distortions introduced by said digital to analog converter when converting said digital sine signal are determined.

2. The method of claim 1 wherein at least one calibration path from said plurality of calibration paths has its attenuation ratio adjustable.

3. The method of claim 1 wherein the analog signal passing from said digital to analog converter through any of said calibration paths to said analog to digital converter is transferred by electricity.

4. The method of claim 3 wherein output of said digital to analog converter, said calibration paths, and input of said analog to digital converter are balanced circuits.

5. The method of claim 3 wherein one said calibration path is a passive low pass filter, and other said calibration path is a passive voltage divider with adjustable attenuation ratio.

6. The method of claim 1 wherein the analog signal passing from said digital to analog converter through any of said calibration paths to said analog to digital converter is transferred by mechanical vibrations.

7. The method of claim 6 wherein said digital to analog converter comprises an electrical digital to analog converter and an electroacoustic transducer, said analog to digital converter comprises a reverse electroacoustic transducer and an electrical analog to digital converter, one said calibration path is an acoustic low-pass filter, and other said calibration path is a direct acoustic line with adjustable attenuation ratio.

8. A method for reducing nonlinear harmonic distortions which are introduced by a digital to analog converter, comprising:

(a) providing a source of a digital signal such that said source is able to provide a precise sine signal at a predetermined fundamental frequency;

(b) providing a digital to analog converter which is able to convert said digital signal to a continuous analog harmonic signal;

(c) providing a plurality of calibration paths such that
    nonlinear distortion of each said calibration path is lower than a predetermined maximum residuum,
    each said calibration path attenuates a passing sine fundamental signal, at said fundamental frequency, by a ratio which differs from a ratio, by which every other calibration path from said plurality of calibration paths attenuates said passing sine fundamental signal, by less than a predetermined maximum difference,
    and each said calibration path shifts phase of a passing sine distortion signal, with frequency above said fundamental frequency, by a value which differs from a value, by which every other calibration path from said plurality of calibration paths shifts phase of said passing sine distortion signal, by more than a predetermined minimum difference;

(d) connecting input of each said calibration path to output of said digital to analog converter;

(e) providing an analog to digital converter which is able to convert a continuous analog signal to a series of digital samples representing a digital form of the analog signal;

(f) connecting input of said analog to digital converter to output of each said calibration path selectively;

(g) providing a memory configured to store at least executable instructions;

(h) providing one or more processors, coupled to at least said memory, the digital input of said digital to analog converter, and the digital output of said analog to digital converter, configured to execute the executable instructions to at least:

determine, sequentially for every combination of one calibration path selected from said plurality of calibration paths and of one frequency selected from frequencies comprising said fundamental frequency and its predetermined harmonic frequencies, attenuation and phase shift at said selected frequency, as introduced by said selected calibration path, using said digital to analog converter to convert a precise digital sine signal, generated at said selected frequency, to analog representation of the signal, and using said analog to digital converter to convert the analog signal from output of said selected calibration path to digital representation of the signal, determine, sequentially for every calibration path selected from said plurality of calibration paths, amplitude of said fundamental frequency and amplitude and phase shift of every predetermined harmonic frequency of said fundamental frequency contained in frequency spectrum of a digital signal produced by said analog to digital converter, using said digital to analog converter to convert a digital sine signal, generated at said fundamental frequency and with a predetermined fundamental amplitude, to analog representation of the digital signal, and using said analog to digital converter to convert the analog signal, produced by said selected calibration path, to the digital signal, calculate, sequentially for every predetermined harmonic distortion frequency of said fundamental frequency, values of unknown variables which solve, up to a predetermined precision, a system of mathematical equations in which every equation describes transfer characteristics of one said calibration path and in which the unknown variables stand for distortion frequency amplitude and phase shift introduced by said digital to analog converter at said predetermined harmonic distortion frequency, pre-distort said precise digital signal, provided by said source of a digital signal, with sine signals of said distortion frequencies having amplitudes equal to and phase shifts rotated by 180 degrees from the calculated harmonic distortions introduced by said digital to analog converter, pass the pre-distorted digital signal to said digital to analog converter;

whereby said digital to analog converter outputs a precise analog sine signal in which said harmonic distortions introduced by said digital to analog converter are substantially reduced.

9. The method of claim 8 wherein at least one calibration path from said plurality of calibration paths has its attenuation ratio adjustable.

10. The method of claim 8 wherein the analog signal passing from said digital to analog converter through any of said calibration paths to said analog to digital converter is transferred by electricity.

11. The method of claim 10 wherein output of said digital to analog converter, said calibration paths, and input of said analog to digital converter are balanced circuits.

12. The method of claim 10 wherein one said calibration path is a passive low pass filter, and other said calibration path is a passive voltage divider with adjustable attenuation ratio.

13. The method of claim 8 wherein the analog signal passing from said digital to analog converter through any of said calibration paths to said analog to digital converter is transferred by mechanical vibrations.

14. The method of claim 13 wherein said digital to analog converter comprises an electrical digital to analog converter and an electroacoustic transducer, said analog to digital converter comprises a reverse electroacoustic transducer and an electrical analog to digital converter, one said calibration path is an acoustic low-pass filter, and other said calibration path is a direct acoustic line with adjustable attenuation ratio.

15. An apparatus which is able to compensate respective harmonic distortions of a digital to analog and analog to digital converters, comprising:

(a) a source of a digital signal such that said source is able to provide a precise sine signal at a predetermined fundamental frequency;

(b) a digital to analog converter which is able to convert said digital signal to a continuous analog harmonic signal;

(c) a plurality of calibration paths such that
nonlinear distortion of each said calibration path is lower than a predetermined maximum residuum, each said calibration path attenuates a passing sine fundamental signal, at said fundamental frequency, by a ratio which differs from a ratio, by which every other calibration path from said plurality of calibration paths attenuates said passing sine fundamental signal, by less than a predetermined maximum difference, and each said calibration path shifts phase of a passing sine distortion signal, with frequency above said fundamental frequency, by a value which differs from a value, by which every other calibration path from said plurality of calibration paths shifts phase of said passing sine distortion signal, by more than a predetermined minimum difference;

and at least one calibration path from said plurality of calibration paths has its amplitude attenuation ratio adjustable;

(d) input of each said calibration path being connected to output of said digital to analog converter;

(e) providing an analog to digital converter which is able to convert a continuous analog signal to a series of digital samples representing a digital form of the analog signal;

(f) a source of an analog measured signal, such that
amplitude of said analog measured signal is smaller or equal to maximum amplitude of a signal which said digital to analog converter is able to produce, fundamental frequency of said analog measured signal differs from fundamental frequency of an analog signal produced by said digital to analog converter converting said precise sine signal by less than a predetermined maximum difference, harmonic distortions of said analog measured signal are at arbitrary level;

(g) input of said analog to digital converter being connected to output of any member selected from a group consisting of said calibration paths and of said source of the analog measured signal;

(h) a memory configured to store at least executable instructions;

(i) one or more processors, coupled to at least said memory, the digital input of said digital to analog converter, and the digital output of said analog to digital converter, configured to execute the executable instructions to at least:

determine, sequentially for every combination of one calibration path selected from said plurality of calibration paths and of one frequency selected from frequencies comprising said fundamental frequency and its predetermined harmonic frequencies, attenuation and phase shift at said selected frequency, as introduced by said selected calibration path, using said digital to analog converter to convert a precise digital sine signal, generated at said selected frequency, to analog representation of the signal, and using said analog to digital converter to convert the analog signal from output of said selected calibration path to digital representation of the signal, determine, sequentially for every calibration path selected from said plurality of calibration paths, amplitude of said fundamental frequency and amplitude and phase shift of every predetermined harmonic frequency of said fundamental frequency contained in frequency spectrum of a digital signal produced by said analog to digital converter, using said digital to analog converter to convert a digital sine signal, generated at said fundamental frequency and with a predetermined fundamental amplitude, to analog representation of the digital signal, and using said analog to digital converter to convert the analog signal, produced by said selected calibration path, to the digital signal, calculate, sequentially for every predetermined harmonic distortion frequency of said fundamental frequency, values of unknown variables which solve, up to a predetermined precision, a system of mathematical equations in which every equation describes transfer characteristics of one said calibration path and in which the unknown variables stand for distortion frequency amplitude and phase shift introduced by said digital to analog converter at said predetermined harmonic distortion frequency, pre-distort said precise digital signal, provided by said source of a digital signal, with sine signals of said distortion frequencies having amplitudes equal to and phase shifts rotated by 180 degrees from the calculated harmonic distortions introduced by said digital to analog converter, pass the pre-distorted digital signal to said digital to analog converter so that it outputs a precise analog sine signal, attenuate the precise analog sine signal by passing it through said calibration path with adjustable attenuation ratio such that amplitude of the attenuated sine signal differs from said amplitude of said analog measured signal by less than a predetermined maximum difference, determine amplitude and phase shift of every predetermined harmonic frequency of said fundamental frequency contained in frequency spectrum of a digital signal produced by said analog to digital converter converting the attenuated precise analog sine signal, post-distort a digital signal produced by said analog to digital converter, when it is converting said analog measured signal, with sine signals of said distortion frequencies having amplitudes equal to and phase shifts rotated by 180 degrees from the determined harmonic distortions introduced by said analog to digital converter;

whereby said digital to analog converter outputs a precise analog sine signal in which harmonic distortions introduced by said digital to analog converter are substantially reduced and said analog to digital converter outputs a digital signal, converted from said analog measured signal, in which harmonic distortions introduced by said analog to digital converter are substantially reduced.

16. The apparatus of claim 15 wherein said source of said analog measured signal is a device-under-test which has its input connected to output of said digital to analog converter.

17. The apparatus of claim 15 wherein the analog signal passing from said digital to analog converter through any of said calibration paths to said analog to digital converter is transferred by electricity.

18. The apparatus of claim 17 wherein one said calibration path is a passive low pass filter, and other said calibration path is a passive voltage divider with adjustable attenuation ratio.

19. The apparatus of claim 15 wherein the analog signal passing from said digital to analog converter through any of said calibration paths to said analog to digital converter is transferred by mechanical vibrations.

20. The apparatus of claim 19 wherein said digital to analog converter comprises an electrical digital to analog converter and an electroacoustic transducer, said analog to digital converter comprises a reverse electroacoustic transducer and an electrical analog to digital converter, one said calibration path is an acoustic low-pass filter, and other said calibration path is a direct acoustic line with adjustable attenuation ratio.

* * * * *